United States Patent
Yamaguchi et al.

(10) Patent No.: US 7,084,498 B2
(45) Date of Patent: Aug. 1, 2006

(54) SEMICONDUCTOR DEVICE HAVING PROJECTED ELECTRODES AND STRUCTURE FOR MOUNTING THE SAME

(75) Inventors: Yoshihide Yamaguchi, Fujisawa (JP); Shigeharu Tsunoda, Fujisawa (JP); Hiroyuki Tenmei, Yokohama (JP); Hiroshi Hozoji, Yokohama (JP); Naoya Kanda, Fujisawa (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/271,572

(22) Filed: Oct. 17, 2002

(65) Prior Publication Data

US 2003/0071331 A1    Apr. 17, 2003

(30) Foreign Application Priority Data

Oct. 17, 2001    (JP) ............................. 2001-319440

(51) Int. Cl.
*H01L 23/48* (2006.01)
*H01L 23/52* (2006.01)
*H01L 29/40* (2006.01)

(52) U.S. Cl. ...................... 257/737; 257/738
(58) Field of Classification Search ........... 257/737, 257/738, 780
See application file for complete search history.

(56) References Cited

U.S. PATENT DOCUMENTS

| 6,277,669 | B1 |   | 8/2001  | Kung et al. ............... 438/106 |
| 6,392,287 | B1 | * | 5/2002  | Kang ....................... 257/669 |
| 6,396,145 | B1 | * | 5/2002  | Nagai et al. .............. 257/737 |
| 6,423,571 | B1 | * | 7/2002  | Ogino et al. .............. 438/106 |
| 6,555,908 | B1 | * | 4/2003  | Eichelberger et al. ..... 257/737 |
| 2002/0000655 | A1 |   | 1/2002 | Shimoishizaka et al. ... 257/734 |
| 2002/0089058 | A1 | * | 7/2002 | Hedler et al. ............. 257/737 |
| 2002/0167075 | A1 | * | 11/2002 | Madrid ..................... 257/666 |

FOREIGN PATENT DOCUMENTS

| JP | 2-272737    | 11/1990 |
| JP | 7-45665     | 2/1995  |
| JP | 11-54649    | 2/1999  |
| JP | 2000-353763 | 12/2000 |

* cited by examiner

*Primary Examiner*—Phat X. Cao
(74) *Attorney, Agent, or Firm*—Antonelli, Terry, Stout and Kraus, LLP.

(57) ABSTRACT

A semiconductor device which includes a semiconductor chip, an insulating film formed on the semiconductor chip, a plurality of projected stress relaxation materials formed on the insulating film, projected electrodes covering at least tops of the stress relaxation materials, and wiring lines for electrically connecting the projected electrodes and element electrodes of the semiconductor chip.

36 Claims, 24 Drawing Sheets

FIG. 2A
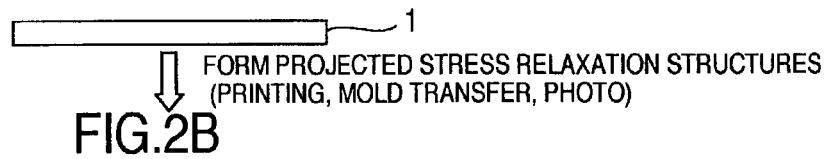
⇩ FORM PROJECTED STRESS RELAXATION STRUCTURES
(PRINTING, MOLD TRANSFER, PHOTO)
FIG. 2B
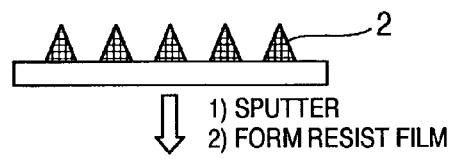
⇩ 1) SPUTTER
⇩ 2) FORM RESIST FILM
FIG. 2C
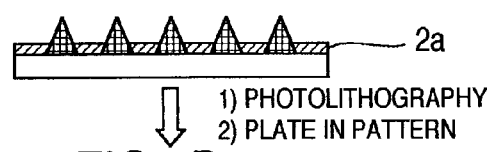
⇩ 1) PHOTOLITHOGRAPHY
⇩ 2) PLATE IN PATTERN
FIG. 2D
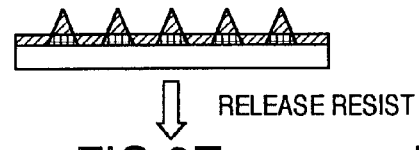
⇩ RELEASE RESIST
FIG. 2E  FIG. 2F  FIG. 2G
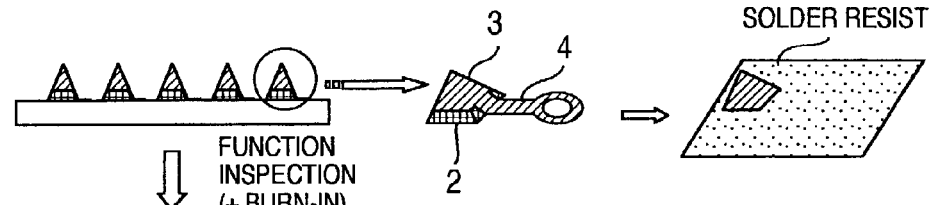
⇩ FUNCTION INSPECTION (+ BURN-IN)
⇩ SOLDER RESIST
FIG. 2H
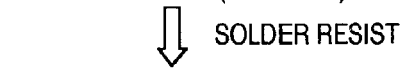
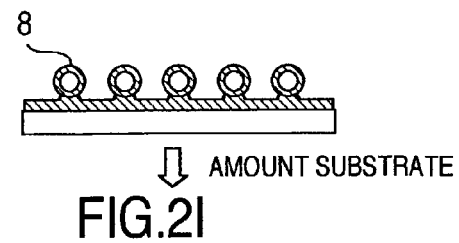
⇩ AMOUNT SUBSTRATE
FIG. 2I
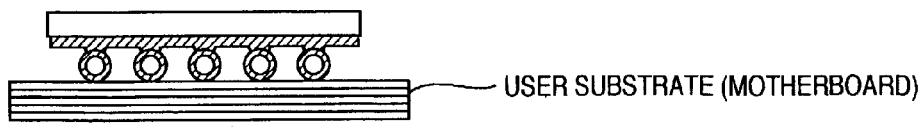

TEST RESULTS SHOWING RELATIONSHIP BETWEEN GLASS TRANSITION TEMPERATURE AND LINEAR EXPANSION COEFFICIENT (○:NO ABNORMALITY, △: CORRUGATION, X:CRACKING)

RESIN FILL/PRINT INTO MOLD

TRANSFER ONTO WAFER

EXPOSURE/DEVELOPMENT

MACHINING (LASER PROCESSING)

COOL AFTER MELTED

PARTIAL ENLARGED VIEW

WAFER TOP VIEWS

SEMICONDUCTOR DEVICE HAVING PROJECTED ELECTRODES AND STRUCTURE FOR MOUNTING THE SAME

BACKGROUND OF THE INVENTION

The present invention relates to semiconductor devices and structures for mounting the semiconductor devices and more particular, to a semiconductor device having a stress relaxation structure and a method for manufacturing the semiconductor device.

In order to secure the reliability of connection between a semiconductor device and a substrate for mounting the semiconductor device thereon, a layer for relaxing a stress induced between the semiconductor device and substrate is formed therebetween.

For example, JP-A-11-54649 (referred to as the first known example, hereinafter) discloses a semiconductor device wherein a layer having a low elastic modulus is formed on a semiconductor substrate and a plurality of metallic balls are formed on the low elastic modulus layer as external connection terminals.

Also disclosed in JP-A-2-272737 (referred to as the second known example, hereinafter) is a projected electrode structure of semiconductor which includes an aluminum pad electrode for a semiconductor microchip, a protective film formed on the semiconductor element except for part of the aluminum pad electrode, a projection formed on the protective film, a connection pattern provided so as to cover the pad electrode and the surface of the projection, and an insulating layer provided on the protective film and connection pattern so as to expose at least the top of the projected electrode having the projection and pattern.

Further disclosed in JP-A-7-45665 (referred to as the third known example, hereinafter) is a circuit board wherein, in order to relax a stress induced resulting from a difference in thermal expansion coefficient between the circuit board and a semiconductor microchip, a layer made of a material having a small elastic modulus (low elastic modulus resin layer) is provided under a connection electrode layer of the circuit board having a projected electrode of the semiconductor element joined thereto.

JP-A-2000-353763 (referred to as the fourth known example, hereinafter) also discloses a projected electrode which includes a rewiring layer formed on a semiconductor wafer, a Cu plated layer provided on the wafer for connection with the rewiring layer, a resin film layer of a trapezoidal shape formed on the Cu plated layer, and a metallic layer formed on the film layer for connection with the plated layer.

SUMMARY OF THE INVENTION

In the semiconductor device of the first known example, a plurality of external connection terminals are formed on a single stress relaxation layer. For this reason, it is difficult to efficiently relax a stress applied to the respective external connection terminals with use of the stress relaxation layer. Further, since the stress relaxation layer has a slope part, a flat part of the stress relaxation layer, on which the external connection terminals are to be formed, becomes narrower. In a semiconductor device having the multiplicity of external connection terminals, thus, it becomes more difficult to make the device small in size and to increase the number of such pins. When the stress relaxation layer contains a filler, further, the stress relaxation layer has a rough surface and thus it is hard to form a fine wiring on the surface of the stress relaxation layer. In addition, for the purpose of forming a wiring on a slant part, an light exposure machine or equipment having a deep (large) focal depth is required and it becomes necessary to form a thick resist film on the wiring layer.

Further, the aforementioned second to fourth known examples have a problem that, since the entire projection playing a role in relaxing a stress is entirely covered with the metallic layer or the like, the stress relaxing function of the projection is reduced.

In the second to fourth known examples, furthermore, no consideration is paid to a problem that alpha ray is generated at radioactive elements such as uranium contained as impurities in solder decay so as to involve the erroneous operation of a transistor part of the semiconductor element.

The aforementioned second to fourth known examples fail to teach and disclose the fact that the semiconductor device is examined with use of the projection for relaxing a stress.

In this case, the solder used as the external connection terminals of the semiconductor device tends to employ a Pb-free solder (lead-free) taking the environmental influence or impact thereof into consideration. Since the Pb-free solder is harder and brittler than conventional solder, it is further demanded to employ some means for improving a connection reliability between the semiconductor device and the substrate having the semiconductor device mounted thereon. In addition, in the case of the Pb-free solder, radioactive elements contained in the solder as impurities include polonium as a remaining radioactive element. And in order to shield alpha rays generated during polonium element decay, some means is required to be taken.

It is therefore an object of the present invention to provide a semiconductor device which can secure a higher connection reliability by relaxing a stress generated between the semiconductor device and a substrate having the semiconductor device mounted thereon.

Another object of the present invention is to provide a semiconductor device which can be made thinner than a conventional semiconductor device having a stress relaxation layer.

A further of the present invention is to provide a semiconductor device which includes a stress relaxation layer having an alpha ray shielding performance.

Yet another object of the present invention is to provide a semiconductor device which has Pb-free solder and can improve a connection reliability.

A still further object of the present invention is to provide a method for facilitating inspection of a semiconductor device with use of a stress relaxation structure of a projected shape formed on the semiconductor device.

The above objects can be attained providing inventions disclosed in the present application. Typical ones of the disclosed inventions will be briefly explained as follows.

In accordance with an aspect of the present invention, there is provided a semiconductor device which includesa semiconductor chip, an insulating film formed on the semiconductor chip, a plurality of projected stress relaxation materials formed on the insulating film, projected electrodes covering at least tops of the stress relaxation materials, and wiring lines for electrically connecting the projected electrodes and element electrodes of the semiconductor chip.

In accordance with another aspect, there is provided a semiconductor device which includes a semiconductor chip, an insulating film formed on the semiconductor chip, a plurality of projected stress relaxation materials formed on the insulating film, external connection terminals formed for the respective stress relaxation materials, and wiring lines for electrically connecting the each external connection terminals and element electrodes of the semiconductor chip.

In the semiconductor element, the projected electrodes cover nearly half of upper parts of the projected stress relaxation materials.

In the semiconductor device, parts of the wiring lines are formed on slant parts of the stress relaxation materials.

In the semiconductor device, the wiring lines are formed wider at rising parts of the projected stress relaxation materials.

In the semiconductor device, the wiring lines include at least two sorts of wiring lines having different wiring line widths.

In the semiconductor device, the projected stress relaxation materials have a nearly cone shape.

In the semiconductor device, the projected stress relaxation materials have a nearly trapezoid shape.

In the semiconductor device, the projected stress relaxation materials have a nearly hemisphere shape.

In the semiconductor device, the projected electrodes are made of lead-free solder which does not contain lead positively.

Further, there is provided a mounting structure in which the semiconductor device is mounted on a substrate.

There is also provided a mounting structure in which a plurality of semiconductor devices are mounted on a substrate, and at least one of the plurality of semiconductor devices is the aforementioned semiconductor device.

In accordance with a further aspect of the present invention, there is provided a method for manufacturing a semiconductor device which includes the steps of preparing a semiconductor wafer having an element circuit formed thereon, forming an insulating film on the semiconductor wafer, forming a plurality of projected stress relaxation materials on the insulating film, forming external connection terminals on the stress relaxation materials, and separating the semiconductor wafer into individual chips. The stress relaxation materials are formed with use of a mold of a pyramid shape formed by subjecting a silicon substrate to anisotropic etching.

In accordance with yet another aspect of the present invention, there is provided a method for manufacturing a semiconductor device, which includes the steps of preparing a semiconductor wafer having an element circuit formed thereon, forming an insulating film on the semiconductor wafer, forming a plurality of projected stress relaxation materials on the insulating film, forming external connection terminals on the stress relaxation materials, and dividing the semiconductor element into individual chips. The stress relaxation materials are formed with use of a mold formed by machining.

In accordance with a still further aspect of the present invention, there is provided a method for manufacturing a semiconductor device which includes the steps of preparing a semiconductor wafer having an element circuit formed thereon, forming an insulating film on the semiconductor wafer, forming a plurality of projected stress relaxation materials on the insulating film, forming external connection terminals on the stress relaxation materials, and dividing the semiconductor wafer into individual chips. The stress relaxation materials are formed by printing with use of a mask.

In the method for manufacturing a semiconductor device, the step of forming external connection terminals on the stress relaxation materials has a step of forming projected electrodes covering at least tops of the stress relaxation materials and a step of forming wiring lines for electrically connecting the projected electrodes and element electrodes of the semiconductor device.

In the method for manufacturing a semiconductor device, the projected electrodes and the wiring lines are formed in an identical step.

The method for manufacturing a semiconductor device further includes a step of bringing a semiconductor probe having flattened contact parts into contact with the projected electrodes to inspect a semiconductor element formed on the semiconductor wafer.

Other objects, features and advantages of the invention will become apparent from the following description of the embodiments of the invention taken in conjunction with the accompanying drawings.

BRIEF DESCRIPTION OF THE DRAWINGS

FIGS. 2A to 2I show an example of a method for manufacturing a semiconductor device;

DETAILED DESCRIPTION OF THE EMBODIMENTS

Figure 1:
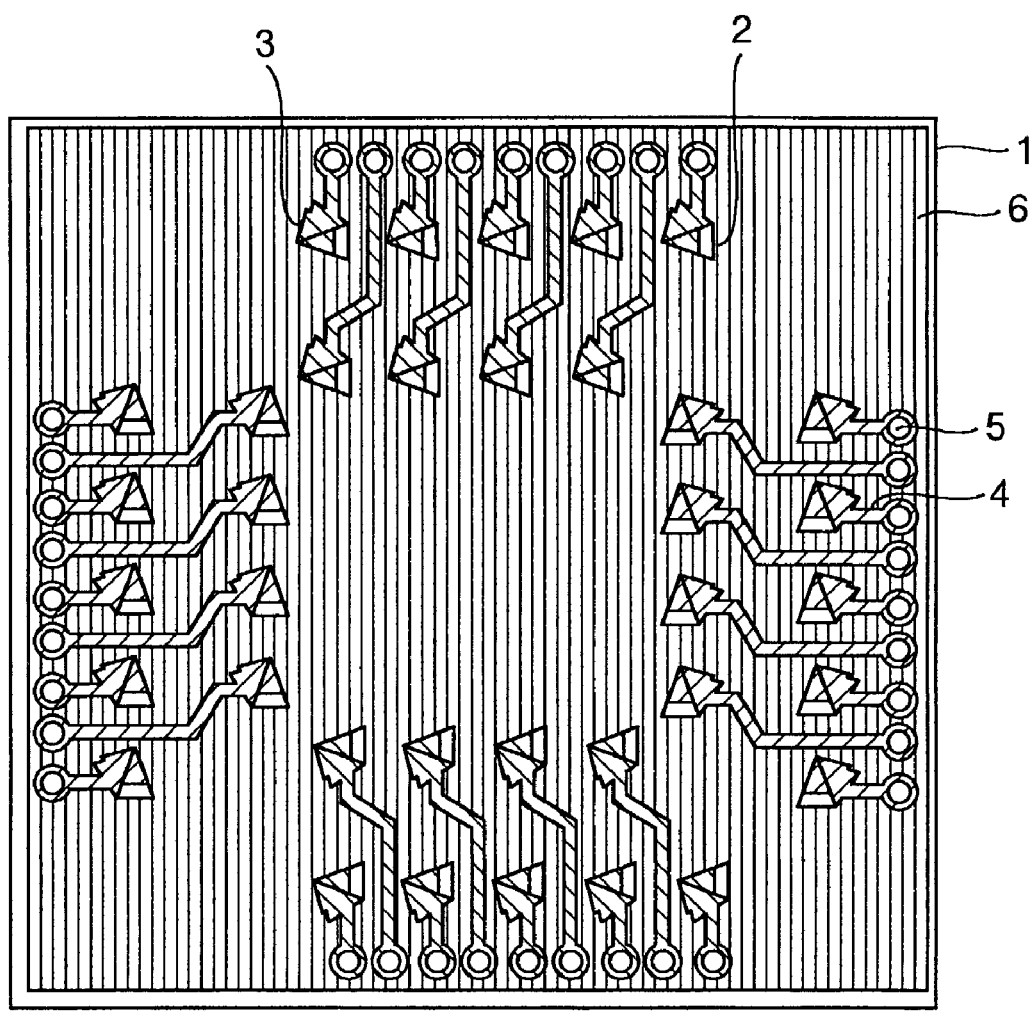
FIG. 1 shows a semiconductor device in accordance with an embodiment of the present invention.

The present invention will be explained in connection with embodiments of the invention with reference to accompanying drawings. In all the drawings, parts having the same reference numerals or symbols indicate identical parts, and some of the parts are omitted to avoid double explanation in some cases. Further, for the sake of easy explanation, dimensional ratios between the parts are changed in the drawings.

In the embodiments, a semiconductor chip refers to a chip which is cut out from a semiconductor wafer having element circuits formed thereon and contains no wiring and stress relaxation structure. A semiconductor element refers to an element (in a semiconductor wafer state) which is before a semiconductor chip cut out from a semiconductor wafer having element circuit formed therein. That is, a difference between the semiconductor chip and semiconductor element depends on whether or not the semiconductor wafer is diced into individual chips. Further, a semiconductor device refers to a semiconductor chip having a wiring and stress relaxation structure formed thereon.

(General Configuration)

FIG. 1 is an upper view of a semiconductor device in accordance with an embodiment of the present invention, and FIGS. 2A to 2I show, in cross-sectional views, an example of how to manufacture the semiconductor device, which will be detailed below. In FIG. 1, for easy understanding of the structure of the semiconductor device in accordance with the present embodiment, a resin layer 7 provided on an uppermost surface layer of the semiconductor device for the purpose of inter-wiring insulation and wiring protection as well as external connection terminals (solder bumps) 8 are omitted. Further, FIG. 3 shows projected electrodes arranged in an area array on a semiconductor element in a wafer state, wherein a wafer is provided therein with a space 31 as a cut margin when the wafer is divided into individual semiconductor devices.

In these drawings, reference numeral 1 denotes a semiconductor chip, numeral 2 denotes a plurality of stress relaxation structures of stress relaxation material formed as projections on a surface protective film 6, 3 denotes projected electrodes covering at least parts of the stress relaxation structures 2 respectively, 4 wiring layers (or re-wiring layers) for connecting the projected electrodes 3 and associated element electrodes 5. The element electrodes 5 are formed on the semiconductor chip 1, and the surface protective film 6 is a passivation film or the like formed on the semiconductor chip 1 except for at least part of upper parts of the element electrodes 5. Formed on the upper parts of the projected electrodes 3 are solder bumps 8 which are to be formed as the external connection terminals. In this connection, the element electrodes 5 may have a nearly rectangular shape as shown in FIG. 1 or a nearly circular shape as shown in FIG. 3, or the shape of the element electrodes may be selected according to the application and characteristic of the semiconductor chip. For example, the nearly circular shape can be easily formed in many cases, whereas, the nearly rectangular shape is convenient for inspection of its electrical characteristics in many cases.

Figure 3:
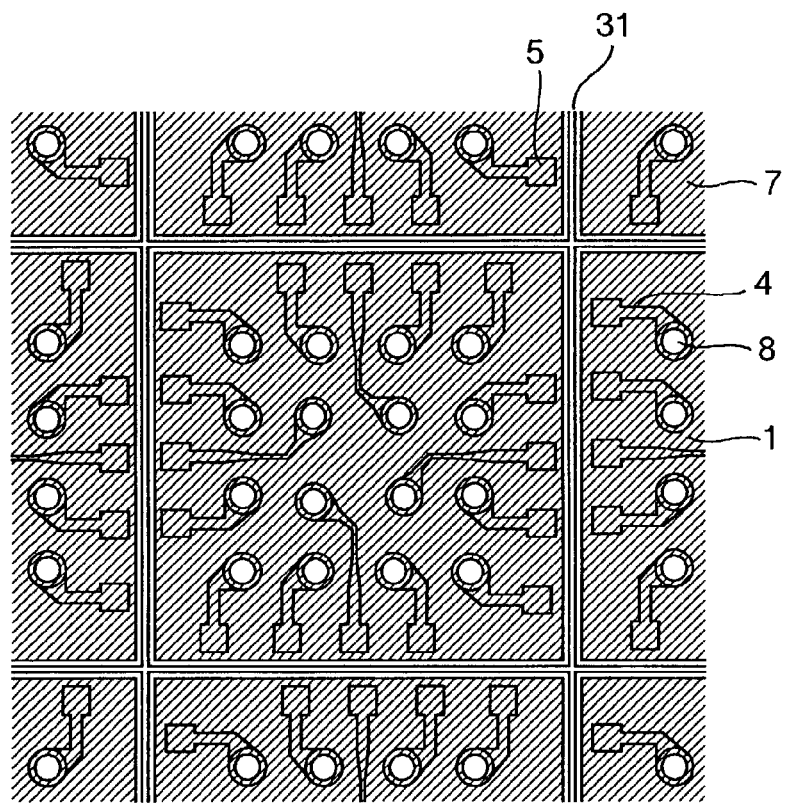
FIG. 3 shows projected electrodes arranged in an area array.

Since FIG. 3 is a diagram when viewed directly from the above, the surface protective film 6 is overlapped with the resin layer 7 provided on the uppermost surface layer of the semiconductor device, while projections of the stress relaxation structures 2 cannot be observed because they are hidden by the bumps 8. When the projected electrodes 3 and wiring layers 4 are formed with use of the same conductor layer, it is preferable from the viewpoint of low cost fabrication. However, the wiring layers 4 may be formed in two separate steps according to its application and purpose or the wiring layers 4 and projected electrodes 3 may be formed respectively, without any troubles. An example of forming the wiring layers 4 in two respective steps will be explained later.

As will be obvious from FIG. 1, in the semiconductor device of the present embodiment, a stress relaxation layer is provided for each of the external connection terminals (solder bumps) of the semiconductor device. As a result, when compared with the structure proposed by the aforementioned first known example and having the stress relaxation layer formed on the semiconductor device in a broad range, the stress relaxation structure can have a small section modulus and stress imposed on the respective external connection terminals can be efficiently relaxed. Accordingly, the connection reliability of the semiconductor device can be improved and a connection life can be prolonged.

Further, discrete projected stress relaxation materials may be arranged at any locations on the element. Accordingly, the discrete stress relaxation structures 2 may be positioned on the entire surface of the semiconductor chip without causing any special problem and are not required to have the same size, that is, may have different sizes.

The element electrodes 5 may be freely positioned on the surface of the semiconductor chip 1. For example, as shown in FIG. 3, the element electrodes may be provided in a specific region of the semiconductor element and, for example, in the center part of the element or at the periphery of the element (as in FIG. 3), or may be arranged as distributed on the entire surface of the semiconductor chip 1 as shown in FIG. 4.

Figure 5:
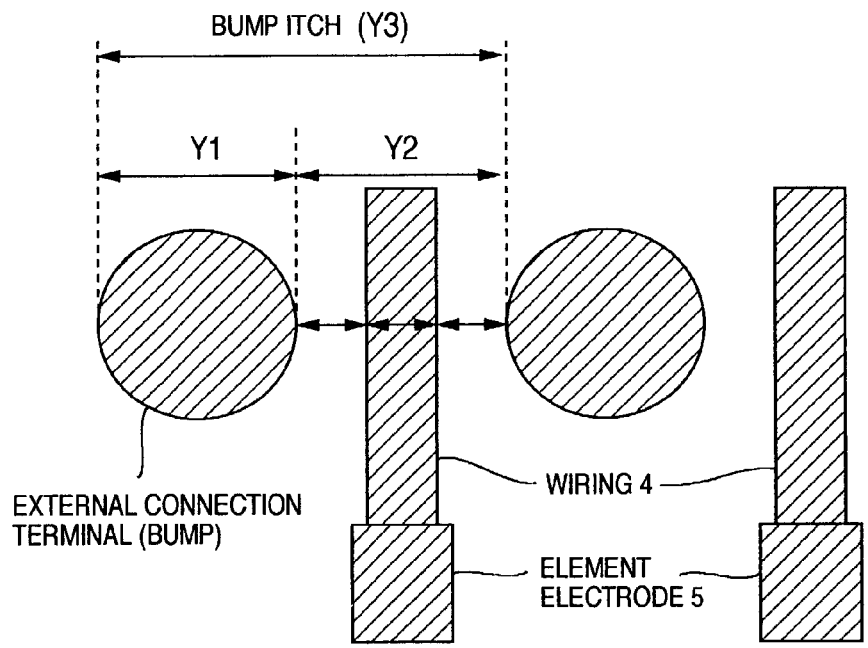
FIG. 5 shows a relation between the diameter of external connection terminals and the width of wiring layers.

In FIG. 3, since the wiring layer 4 (also referred to as the re-wiring layer) is provided so as to pass between solder bumps in the outermost column, the wiring width of the wiring layer 4 is limited. The solder bumps 8 are formed on the upper parts of the projected electrodes 3. When the solder bumps are arranged in the periphery in two columns as shown in FIG. 3, one wiring line will be passed between at least any ones of the solder bumps. Assume now that, as shown in FIG. 5, the diameter Y1 of the external connection terminals (solder bumps) is the same as the distance Y2 of the adjacent external connection terminals at their peripheries and that a distance between the wiring layer 4 and the periphery of the adjacent external connection terminal is the same as the width of the wiring line taking electrical interference into account. Then the maximum of the wiring line width becomes about 1/6 of a bump pitch Y3. When the number of peripheral columns is 'n' under the same conditions as the above, a relationship between the maximum value of the wiring line width and the solder bump pitch is expressed by an approximation equation which follows.

Solder bump pitch≈2×{(maximum wiring line width)×(2n−1)}

Figure 4:
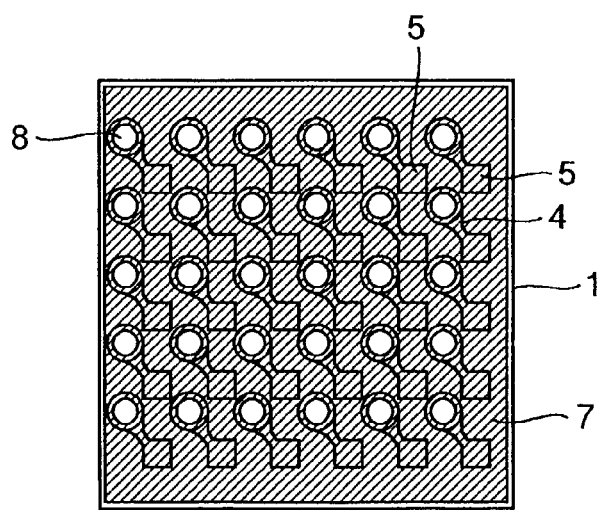
FIG. 4 shows element electrodes arranged as distributed on the entire surface of an element.

When element electrodes are provided as distributed on the entire surface of the element thereon as shown in FIG. 4, on the other hand, the need for provision of the wiring layer 4 between the bumps is eliminated and the need for long extension of the wiring layer 4 is also removed. In this case, a relationship between the maximum wiring line width and solder bump pitch can be expressed by an approximation equation which follows.

Solder bump pitch 2≈(maximum wiring line width

As will be clear from the above two equations, when element electrodes are provided as distributed on the entire surface of the element, (1) the bump pitch can be shortened in the case of the same wiring line width and (2) the wiring line width can be increased in the case of the same bump pitch.

When the bump pitch can be shortened, a desired number of bumps can be provided even the size of the element is small, thus enabling element shrinkage. That is, an increased number of terminals can be provided for an unchanged package size.

When the bump pitch is fixed at an unchanged value and the wiring line width is increased, electrical characteristics can be improved including reduced wiring line resistance. As has been mentioned above, the length of the wiring layer 4 in the structure of FIG. 4 is shorter than that in the structure of FIG. 3. Thus when the resistances of the wiring lines are made the same, the wiring line width can be made small. In this way, when the wiring line width is made small, this is advantageous from the viewpoint of electrical characteristics including electrical capacity between wiring lines.

Figure 6:
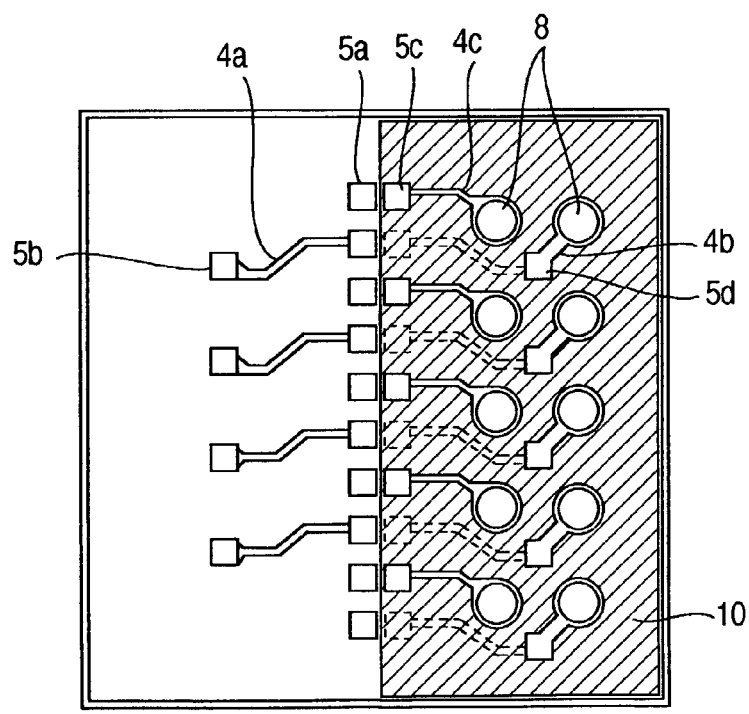
FIG. 6 shows a semiconductor device having a wiring layer of a double layer structure.

In this connection, the wiring layer 4 may be formed in two respective steps if necessary. For example, as exemplified in FIG. 6, the wiring layer 4 may be formed to have a two-layer structure. In FIG. 6, element electrodes 5 are formed in two columns (unseen in the drawing because they are hidden by connection electrodes 5a and 5c), and solder bumps 8 are formed in the periphery of a semiconductor device in two columns. The element electrodes 5 and solder bumps 8 are electrically connected by means of the connection electrodes 5a to 5d (the connection electrodes 5a and 5c being formed on the element electrodes 5) and wiring layers 4a to 4c. In the left half of FIG. 6, for your convenience, outermost surface resin layer 7 and second wiring layer 4c and an interlayer insulating layer 10 is omitted in the drawing so that the first wiring layer 4a can be seen; while in the right half of FIG. 6, is omitted in the drawings so that the second wiring layer 4c can be seen and the outermost surface resin layer 7 and the first wiring layer 4a is shown by dotted lines as assembly seen through the interlayer insulating layer.

That is, part (first wiring layer 4a) of the wiring layers 4 is formed under the bump as an underlying layer. Further, the first wiring layer 4a is connected to the connection electrodes 5a formed directly above the element electrodes 5 and to the connection electrodes 5b formed under the bump as an underlying layer and positioned therebetween. The connection electrodes 5b are connected to bumps closer to the outer peripheral of the semiconductor device via the connection electrodes 5d formed above the connection electrodes 5b and the wiring layer 4b (second wiring layer). Another part (wiring layer 4c) of the second wiring layer connects the connection electrodes 5c formed directly above the element electrodes 5 and ones of the bumps 8 closer to the center of the semiconductor device.

When the wiring layer is made to have a two-layer structure, not only the structural interference of the wiring layer with the bumps but also the electrical interference thereof can be reduced. Thus, the wiring line width can be increased while the total length of the first wiring layers 4a and 4b is not changed so largely when compared with the corresponding wiring line length in FIG. 3, or conversely the bump pitch can be decreased when the widths of the wiring lines are made unchanged.

The connection electrodes 5a are at the same level as the first wiring layer, and the connection electrodes 5c are at the same level as the second wiring layer. The connection electrodes 5a are stacked on the element electrodes 5 and the connection electrodes 5c are stacked on the connection electrodes 5a. In the example of FIG. 6, thus, the diameters of the electrodes are increased in this sequence, so that electrodes located thereunder cannot be seen. As another structural example, the connection electrodes 5a under the connection electrodes 5c may be omitted and the connection electrodes 5c may be connected directly to the element electrodes 5.

(Stress Relaxation Structure)

The thicknesses of the respective stress relaxation structures of a semiconductor device in accordance with the present embodiment are set at values in a range of about 10 μm to about 150 μm. In the case of the structure proposed in the aforementioned first known example wherein stress relaxation layer is formed on a broad range of the surface of the semiconductor device, the structure is required to have a thickness of about 35 μm to 150 μm; whereas, in the case of the structure of the semiconductor device of the present embodiment, a stress can be more efficiently relaxed, whereby the thicknesses of the stress relaxation structures can be made small. Accordingly, the semiconductor device in accordance with the present embodiment can realize its thinner thickness.

For the purpose of preventing the erroneous operation of a transistor caused by ultraviolet rays, alpha rays generated from solder balls, etc., it is desirable that the stress relaxation structures have thicknesses of about 30 μm, but the thicknesses may be selected as necessary taking the element characteristics, stress relaxing characteristics of the semiconductor device, the structure of the wiring layer 4, etc. into consideration. That is, when it is desired to make the thicknesses of the stress relaxation layers smaller, the erroneous operation of the transistor can be prevented by suitably adjusting the material and thickness of the wiring layer 4. For example, the alpha ray shielding constant of a conductor such as copper or nickel material used for the wiring layer 4 corresponds to about 3 or 4 times the alpha ray shielding constant of organic resin used for the stress relaxation structure. Thus, in order to make the thickness of the stress relaxation structure thin by 10 μm, the wiring layer 4 is only required to make the thickness of the wiring layer 4 thick by an amount of 2–3 μm. It goes without saying that the wiring layer efficiently shields ultraviolet light and visible light.

In this connection, for a programmable ROM or the like which is used to erase contents recorded therein by means of ultraviolet light irradiation, it is desirable to set the thickness of the stress relaxation layer smaller than the aforementioned value.

In this connection, the pitch of the adjacent solder bumps 8 as mentioned above is expressed as follows.

Solder bump pitch≈2×{(maximum wiring line width)×(2n−1)}, or

Solder bump pitch≈2×(maximum wiring line width)

The structure shown in FIG. 3 or 4 has stress relaxation structures each of which is formed under each one of the respective bumps. Thus, similarly to the above, the pitch of the stress relaxation structure can also be expressed by an equation which follows.

(Stress relaxation structure pitch)≈2×{(maximum wiring line width)×(2n−1)}, or (Stress relaxation structure pitch)≈2×(maximum wiring line width)

It goes without saying from its practical viewpoint that the pitch of the stress relaxation structures is limited also by the yield of a process of forming the bumps thereabove.

Further, the stress relaxation structure has a shape desirably of a projected shape such as a cone or a projection a tip end of which is flattened, such as a nearly truncated cone or a nearly truncated pyramid.

Figure 7:
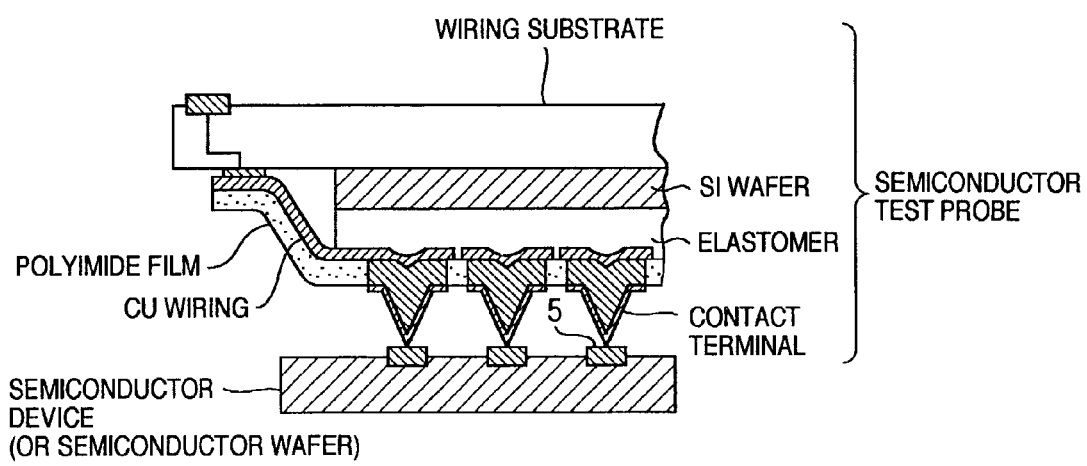
FIG. 7 shows a contacted state between a semiconductor test probe having contact terminals each having a sharp-pointed tip end and a semiconductor device.

In the case of the cone shape, inspection (operational inspection) of the semiconductor device (semiconductor element) can be easily conducted at the wafer level with use of the stress relaxation structures and projected electrodes formed thereon. More specifically, in the conventional inspection of a semiconductor device (semiconductor element), as shown in FIG. 7, the inspection has been conducted by bringing a semiconductor test probe having pointed contact terminals into contact with electrodes of the semiconductor device (semiconductor element). However, it is not always easy to form the semiconductor test probe in corresponding narrow pitch to that of the element electrode 5 and to sharpen the tip ends of the contact terminals. For this reason, when the element electrodes 5 are positioned on the surface of the semiconductor element, it is required to design it taking a test probe manufacturing cost into consideration. Thus it has been difficult from the viewpoint of its electrical characteristics to provide the element electrodes 5 to obtain an optimum arrangement. For example, when the element electrodes 5 are arranged in the form of an area array as exemplified in FIG. 4, it has been difficult to practically conduct the inspection of the semiconductor device (semiconductor element) in the prior art.

Figure 8:
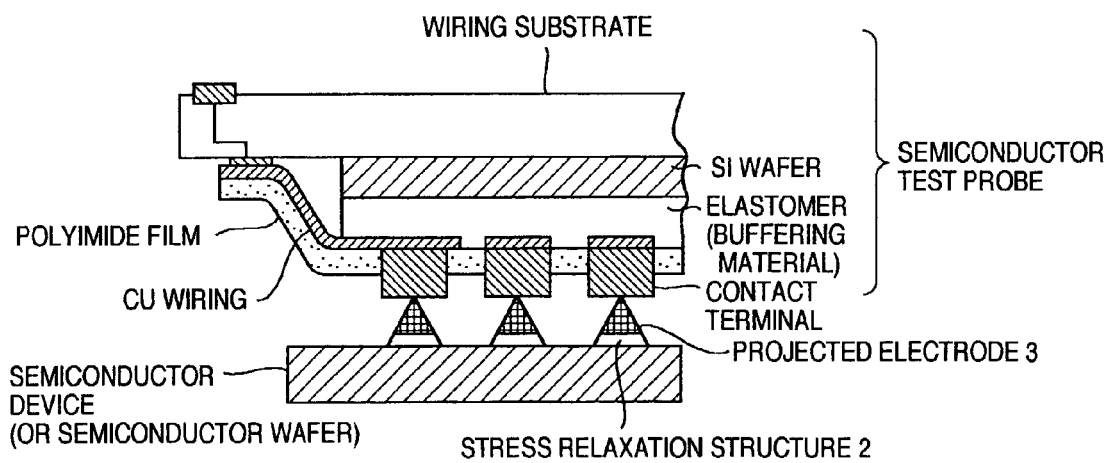
FIG. 8 shows a contacted state between a semiconductor test probe having contact terminals each having a not-sharp-pointed tip end and a semiconductor device.

In the semiconductor device in accordance with the present embodiment, on the other hand, since the projected electrodes themselves of the semiconductor device are sharpened, relative point contact can be realized even when the tip ends of the semiconductor test probe are not pointed, and the projected electrodes having the pointed tip ends can keep good contact with the contact terminals of the semiconductor test probe. Accordingly, as shown in FIG. 8, since a test probe not having pointed tip ends can be used for the performance test of the semiconductor element of the present embodiment, a semiconductor test probe having a narrow pitch or a semiconductor test probe enabling an area array arrangement can be easily manufactured. For this reason, the semiconductor inspection cost using such a probe can be reduced and thus the cost of manufacturing the semiconductor device of the present embodiment can be reduced.

When a conventional semiconductor test probe is used for the inspection of a semiconductor element at a wafer level, probing operation of the probe gradually wears the pointed tip ends of the probe, resulting in that the point contact cannot be maintained eventually. However, when the projected electrodes on the semiconductor element are pointed, this problem can also be solved. More specifically, in the present embodiment, the projected electrodes on the semiconductor element are previously pointed and the inspection of the semiconductor element can be conducted at the wafer level with use of a probe not having pointed tip ends as mentioned above. In the case of such element inspection at the wafer level, even when probing operation is carried out, this will little cause such wear of the tip ends as often seen in the prior art because the probe tip ends are not sharpened. Accordingly, the life of the probe can be prolonged and the cost of manufacturing the semiconductor device can be reduced.

During the probing operation, due to the sharply-pointed tip ends of the projected electrodes on the semiconductor element, very slight wear of the pointed ends may lead to the fact that residual matters generated by the wear are deposited on the probe tip ends and gradually accumulated. In such a case, such residual matters can be removed by performing cleaning operation over the probe tip ends. In the case of the conventional probe, there was a danger that only the cleaning operation causes the pointed tip ends to be made round. However, when such a probe having not pointed ends is used as in the present embodiment, such a danger can be decreased, the cleaning operation of the probe can involve no problem, and conversely the cleaning operation can prolong the life of the probe.

In the present embodiment, the electrodes of the semiconductor device has a stress relaxation structure as mentioned above, so that, even when the electrodes (external connection terminals) of the semiconductor device vary in height, this will generate no problem with the probing operation. This is because, at the time of pushing the tip ends of the probe against the electrodes of the semiconductor device (semiconductor element) through the probing operation, deformation of the stress relaxation structure of the electrodes can relax or accommodate the height variations. Thus, the process margin of steps of manufacturing the semiconductor device can be made spread and consequently the semiconductor device manufacturing cost can also be reduced.

Further, variations in the height of the tip end of the contact terminals of the probe can be accommodated by a similar mechanism to the above. Accordingly, the process margin of steps of manufacturing a probe for inspection of the semiconductor device (semiconductor element) can be made wide so that the inspection probe can be manufactured with a low cost and consequently the manufacturing cost of the semiconductor device as an object to be inspected with use of the probe can be reduced.

In the present embodiment, all the stress relaxation structures formed on an identical semiconductor element are not always required to be identical in thickness and size. For example, when the stress relaxation structures are arranged in the form of an array area or in a plurality of columns in the periphery of the semiconductor device as shown in FIG. 1, it is recommendable that ones of the stress relaxation structures in the outermost periphery easily susceptible to a large stress are made larger than the other stress relaxation structures.

(Physical Property Values and Material of Stress Relaxation Structure)

Usable as the material of the stress relaxation structures 2 is paste-like polyimide, modified amidoimide resin, ester imide resin or the like.

The material of the stress relaxation structures 2 has a glass transition point temperature of preferably not lower than 150° C., more preferably not lower than 180° C., and most preferably not lower than 200° C. When the glass transition point temperature is in such a range, no problem will take place even when the semiconductor element is subjected to a burn-in inspection or the like at a wafer level.

It is further desirable that the material of the stress relaxation structures 2 have a curing temperature of from 100° C. to 250° C. When the curing temperature is lower than the above temperature range, it is difficult to control temperatures in steps of manufacturing the semiconductor device. And when the curing temperature is higher than the above temperature range, the characteristics of the semiconductor element may undesirably vary.

Figure 9:
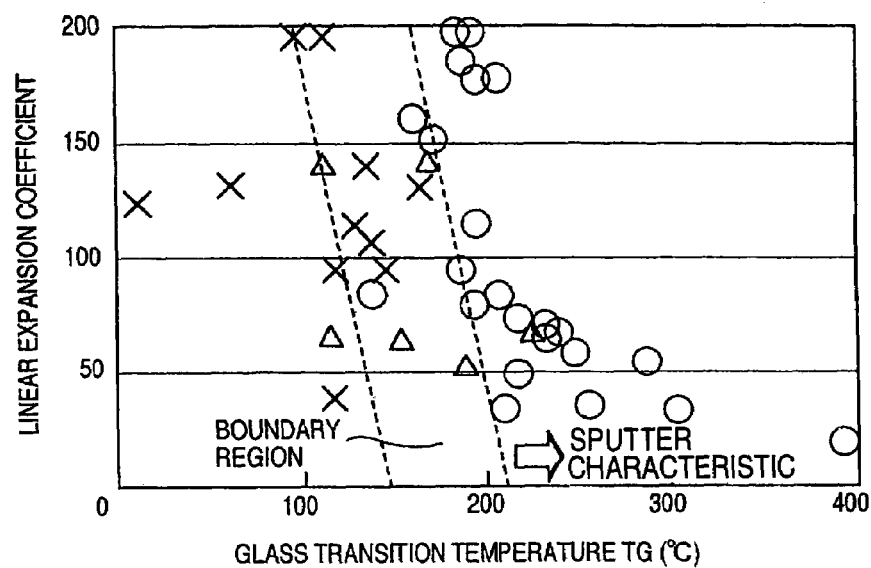
FIG. 9 shows test results of a relationship between glass transition temperature and linear expansion coefficient.

Since the stress relaxation structures after cured are subjected to various steps of sputtering, plating, etching and so on, the structures are also required to have characteristics of heat resistance, chemical attack resistance, solvent resistance and so on. More in detail, as the heat resistance characteristic, the structures have a glass transition temperature Tg desirably not lower than 150° C. and not higher than 400° C., more desirably not lower than 180° C., and most desirably not lower than 200° C. FIG. 9 shows test results of a relationship between glass transition temperature Tg and linear coefficient of thermal expansion. From the test results, it will be turn out that, when the glass transition temperature Tg is not lower than 200° C., no crack takes place in the middle of a manufacturing process. From the viewpoint of suppressing an amount of deformation during treatment of various temperatures in steps, the coefficient of thermal expansion $\alpha 1$ in a range not higher than Tg is smaller (more concretely, closer to 3 ppm) the more preferable. In general, materials having low elastic moduli have large coefficient of thermal expansion in many cases, but it is desirable that the material of the stress relaxation structures 2 suitable in the present embodiment have a coefficient of thermal expansion in a range of 3 ppm–300 ppm. More preferably, the linear thermal coefficient is in a range of 3 ppm–200 ppm and most preferably, 3 ppm–150 ppm.

Meanwhile, a pyrolysis decomposing temperature Td is desirably not lower than about 300° C. When Td is lower than about 300° C., resin deformation, detorioration or decompose may undesirably occur in a thermal step of a process, e.g., in a sputtering or sputtering-etch step. For example, when thermal decompose takes place in the sputtering step, a decomposition gas generated from the resin contaminates a sputter chamber, which undesirably results in formation of a defective sputtered film or adverse influence even on manufacture of the other products. From the viewpoint of chemical attack resistance, it is desirable that dipping of the resin in a 30% sulfuric acid aqueous solution or 10% sodium hydroxide aqueous solution for 24 hours or more cause no resin detorioration such as discoloration or deformation. For solvent resistant property, the resin has a solubility parameter (SP value) of desirably 8–20 $(cal/cm^3)^{1/2}$.

When the constituent material of the stress relaxation structures 2 is made of a modification of base resin containing several components, it is desirable that most of the compositions be in the above solubility parameter range. More specifically, it is desirable that the components having solubility parameters (SP values) smaller than 8 or exceeding 20 be contained by an mount not exceeding 50 weight %. When the components are contained by an amount exceeding the above range, the resin tends to undesirably be expanded and deformed or dissolved during the process.

When the aforementioned chemical attack resistance or solvent resistance property is insufficient, the applicable manufacturing process is limited in some cases, which is not preferred from the viewpoint of reduction of its manufacturing cost. Practically, considering the material cost and process flexibility satisfying these properties synthetically, the material of the stress relaxation structures 2 is determined.

The stress relaxation structure is made of a resin material having an elastic modulus much smaller than that of a semiconductor wafer, e.g., having an elastic modulus (Young's modulus) of 0.1 GPa–20 Gpa and more desirably not larger than 10 GPa at room temperature. When the stress relaxation structure is made of a resin material having an elastic modulus in the above range, a reliable semiconductor device can be provided. In other words, when the stress relaxation structure is made of a resin material having an elastic modulus smaller than 0.1 Gpa, it becomes difficult for the structure to support the weight of a semiconductor chip itself, thus easily involving a problem that, when the structure is used in a semiconductor device, the device becomes unstable in its characteristics. Meanwhile, even when the stress relaxation structure is made of a resin material having an elastic modulus exceeding 10 Gpa, this will not cause a special problem in stress relaxation. However, the sort of such a material is limited and thus it is not necessarily easy to process the material into a desired projected shape.

In the structure proposed in the aforementioned first known example wherein the stress relaxation layer is formed on a wide range of surface of the semiconductor device, an internal stress possessed by the stress relaxation structures 2 themselves causes a problem that a warpage takes place and this tends to easily produce an out-of-focus in a light exposure step. However, the structure proposed in the present application can get easier such a problem.

Projected Electrode

Figure 10A:
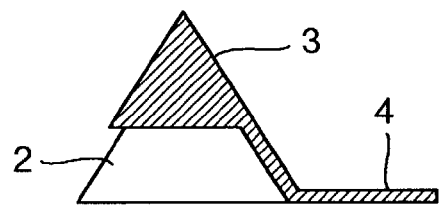
FIGS. 10A to 10D show stress relaxation structures only partly covered with projected electrodes respectively.
Figure 10B:
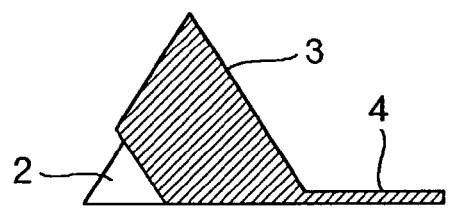
Figure 10C:
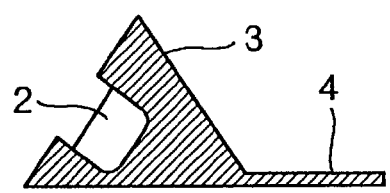
Figure 10D:
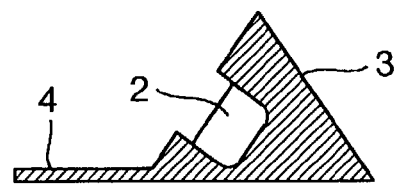

The projected electrodes 3 cover the stress relaxation structures 2. At this time, it is desirable for the projected electrodes 3 to cover only parts of the stress relaxation structures 2. Some specific cross-sectional structures wherein the projected electrodes 3 cover only parts of the stress relaxation structures, are exemplified in FIGS. 10A to 10D. FIG. 10A is a structure wherein the projected electrode covers a nearly-half upper part of the stress relaxation structure 2 of a pyramid shape, FIG. 10B is a structure wherein the projected electrode covers the stress relaxation structure 2 of a pyramid shape except for part of a bottom part of the structure 2, FIGS. 10C and 10D are structures wherein the projected electrodes cover the stress relaxation structures 2 except for portions of the slant middle parts of the structures respectively.

In this connection, the stress relaxation structures 2 are illustrated to have a pyramid shape in FIGS. 10A to 10D. However, the structure 2 shape is not limited to the pyramid but may be another shape such as truncated pyramid, cone, truncated cone or circular cylinder. In the drawing, the solder bumps 8 and outermost surface resin layer 7 are omitted and not illustrated.

It is desirable that at least parts of zones of the stress relaxation structures not covered with the projected electrodes be directed outwardly when viewed from the center of the element. For example, in the case of a structure exemplified in FIG. 11, zones of stress relaxation structures not covered are positioned so as to be directed outside when viewed from the center of an element. With such an arrangement, since deformation of the stress relaxation structures caused by a thermal stress generated between the semiconductor device and the substrate having the semiconductor device mounted thereon can be quickly restored, the stress relaxing effect becomes high.

Figure 11:
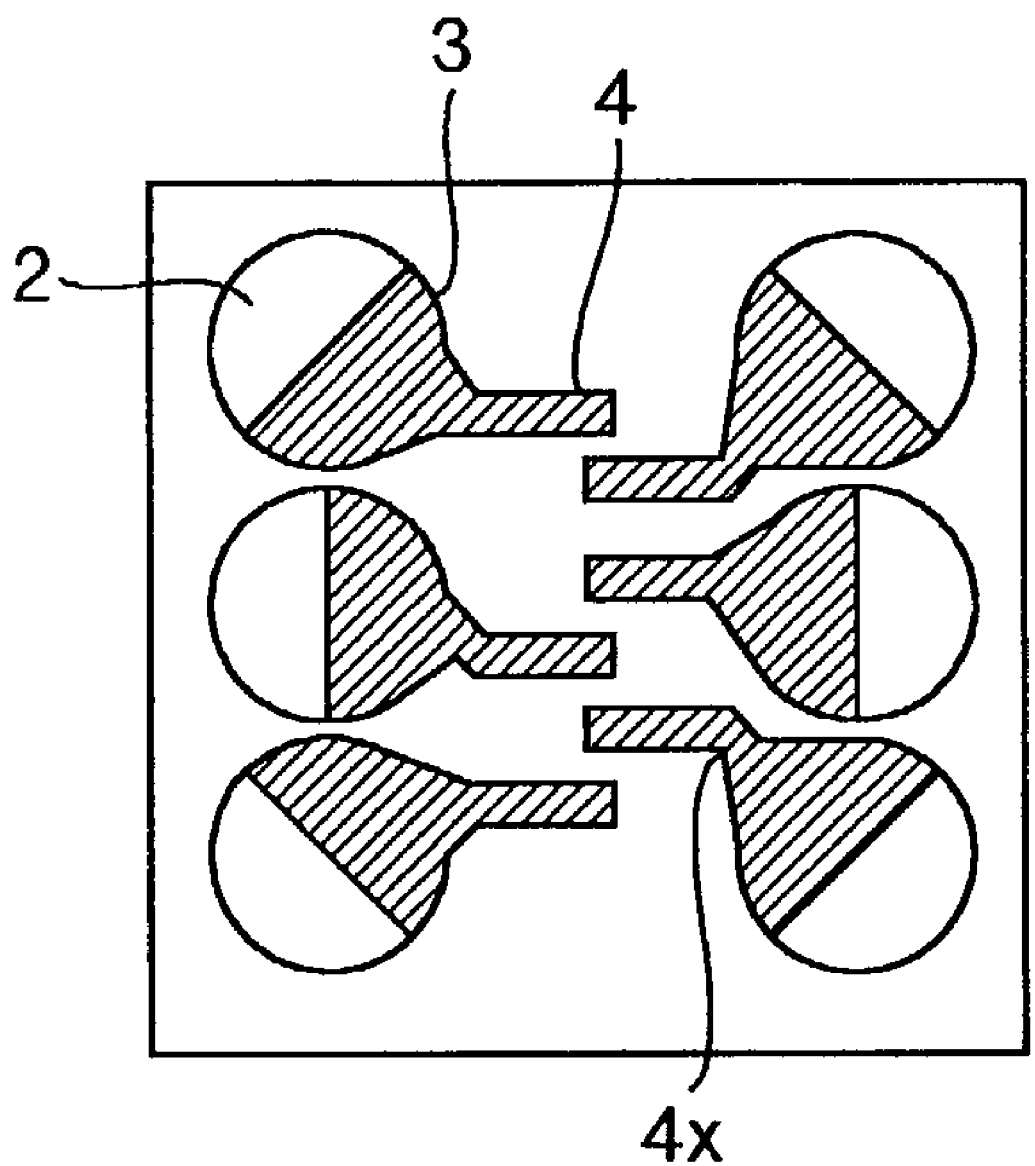
FIG. 11 shows an example wherein unshroud regions of the stress relaxation structures are arranged outside of the element.

FIG. 11 schematically shows a state of the semiconductor device having the stress relaxation structures 2 of a circular cylinder shape when viewed from its directly above side, wherein, for easy understanding of the non-covered parts of the stress relaxation structures, solder bumps and element electrodes are omitted, only the stress relaxation structures 2, wiring layer 4 and projected electrodes 3 are illustrated, and the number of pads is also decreased.

With the arrangement of the present invention, when the above thermal stress causes deformation of the stress relaxation structures, the projected electrodes 3 and at least part of the wiring layer 4 connected thereto are deformed simultaneously with it. Accordingly, under a prolonged operation of the semiconductor device, it can be estimated that repetitive action of the thermal stress on the projected electrodes 3 or wiring layer 4 may gradually develops into its fatigue destruction. To avoid this, in the present invention, (1) the conductor shape (thickness, width, etc.) and material of the projected electrodes 3 and wiring layer 4, (2) the direction of connection between the wiring layer 4 and projected electrodes 3, etc. are suitably adjusted to suppress the fatigue destruction in a practical designed range. For example, the direction of connection between the wiring layer and projected electrodes is selected depending upon the distance and direction thereof from the stress neutral point of the semiconductor device to selectively employ the structure of FIG. 10C or the structure of FIG. 10D. That is, when such a projected electrode structure as shown in FIGS. 10A to 10D, parts of the stress relaxation structures are unshroud differently from the structures proposed in the above second to fourth known example having the projected electrodes 3 covering the entire stress relaxation structures, whereby the stress can be relaxed more effectively.

(Wiring Layer 4)

The projected electrodes 3 and wiring layer 4 can be formed by plating a conductor of material widely known and commonly employed such as Cu in the form of a pattern. In the illustrated example, since the wiring layer is formed on a smooth surface of an insulating film (passivation film), the wiring can be formed finer than the wiring on the stress relaxation layer. Accordingly a semiconductor device having a high density can be provided.

Figure 13:
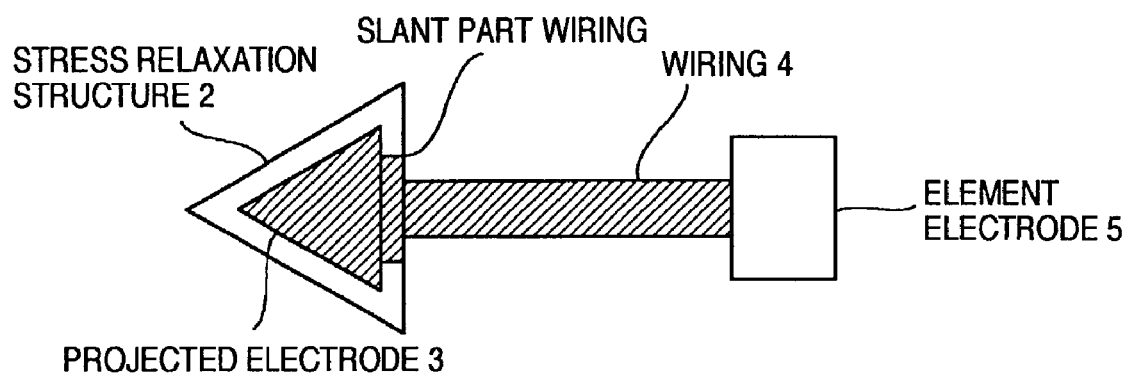
FIG. 13 shows an example of the signal wiring wherein the width of the wiring is made wider at the slant part of a stress relaxation structure.
Figure 14:
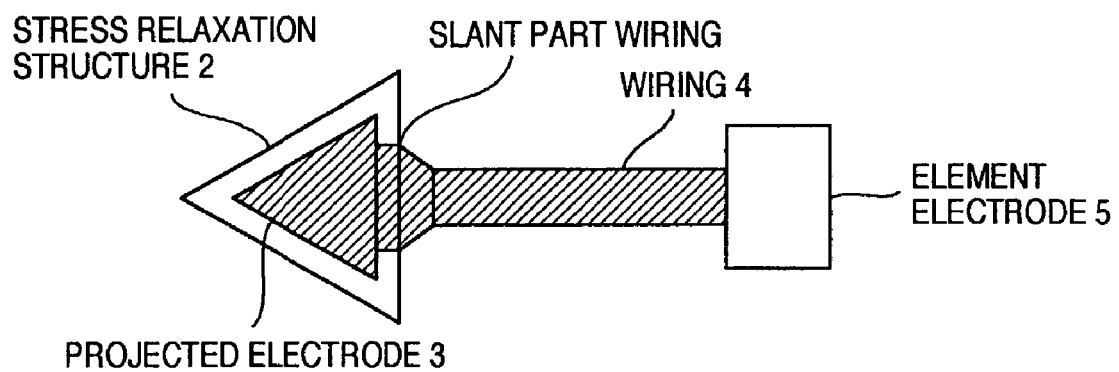
FIG. 14 shows another example of the signal wiring wherein the width of the wiring is made wider at the slant part of a stress relaxation structure.

Further, it is desirable that the wiring layer 4 be formed wider at the rising part of the projected stress relaxation structure 2. For example, such a wiring 4x as shown in FIG. 11 or such wider wirings as shown in FIGS. 13 and 14 are formed. The deformation of the stress relaxation structures 2 tend to easily take place at a contact surface (edge part) between the semiconductor element and stress relaxation structures 2. Thus, when the rising parts of the stress relaxation structures 2 are formed wider, disconnection therebetween can be prevented. In other words, since the wider part of the wiring layer provided for prevention of disconnection of the wiring layer can be restricted only to the rising part of the projected stress relaxation material, the element size can advantageously made small and the number of terminals can be increased.

Figure 12:
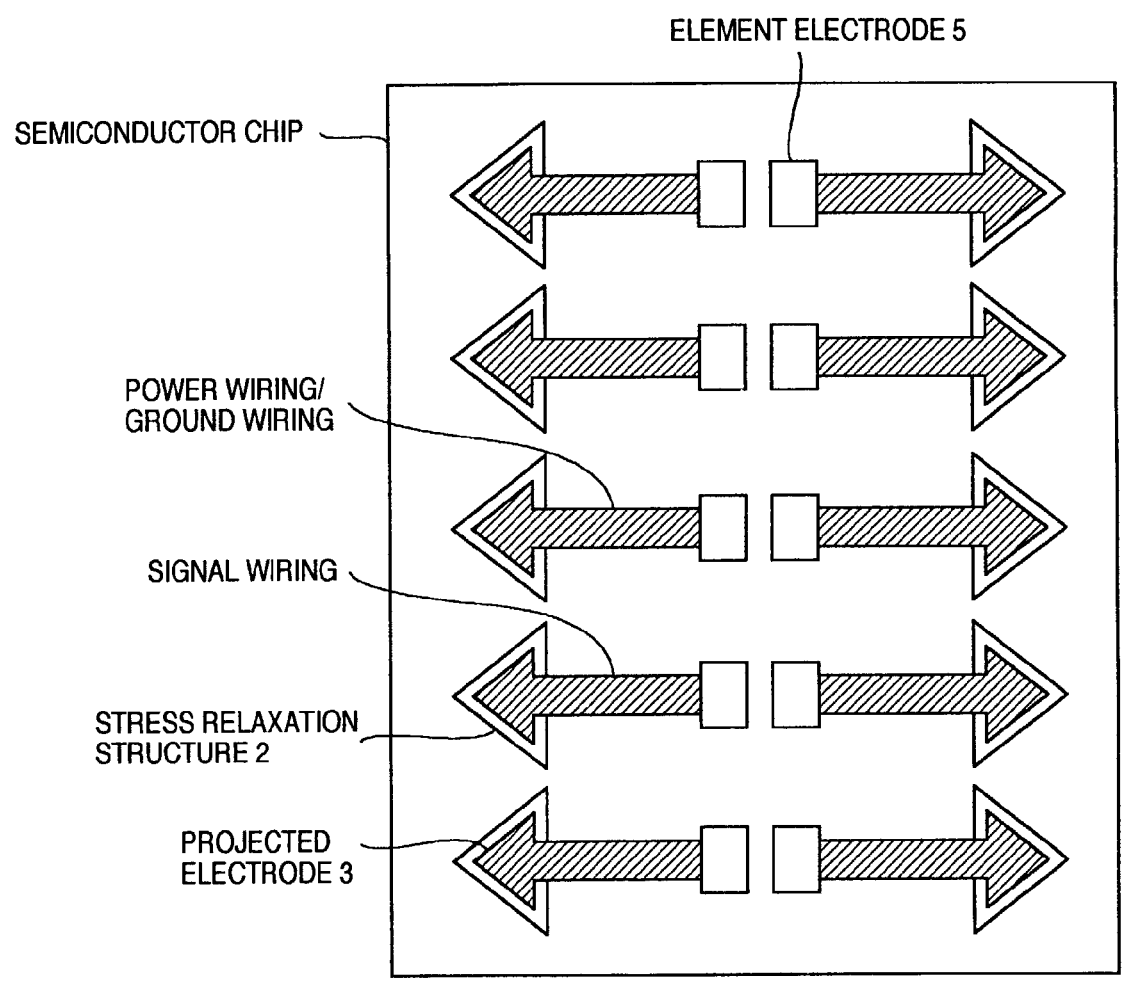
FIG. 12 shows an example wherein a wiring width was changed with a power wiring, a grounding wiring and a signal wiring.

In this conjunction, all the conductor widths of the wiring layers 4 are not required to be the same, but the width of the power wiring line can be made different from that of a ground wiring line and signal line, e.g., as shown in FIG. 12. In this case, when electrical characteristics are taken into consideration, it is generally desirable to make the power and ground wiring lines wider than the signal line.

When the signal line is made wider, this causes increase of a capacity component of the wiring, which affects the semiconductor device during its high speed operation. Conversely, when the power and ground wiring layers are made wider, it can be expected that a power voltage becomes advantageously stable.

It is therefore desirable that the signal wiring lines be patterned to be wider at the slant parts of the stress relaxation structures as shown in FIGS. 13 and 14, whereas, the power or ground wiring lines are made uniformly wider on the slant parts and passivation film.

(External Connection Terminal)

The external connection terminals 8 are formed on the projected electrodes 3. The external connection terminals are made of so-called lead-free solder taking environmental impact into consideration. The 'lead-free solder' refers to such solder as manufactured so as not to positively contain lead in the solder. As the lead-free solder, Sn—Ag-based solder, Sn—Ag—Cu-based solder, Sn—Zn-based solder, and in particular, Sn—3.0 Ag—0.5 Cu solder may be used.

Since the lead-free solder is harder and brittler than lead-contained solder so far used, it is difficult to relax a stress with the external connection terminal itself. However, when the external connection terminals of the lead-free solder are formed on the stress relaxation structures as in the present embodiment, the stresses imposed on the external connection terminals can be reduced.

In the case where the semiconductor device is mounted on an assembly board (user substrate) or the like and the assembly substrate is further mounted on another substrate, it is necessary to be processed in a hierarchical fashion in view of the process temperature, connection of semiconductor device and user substrate are conducted under the different temperature from that for the connection of the user substrate and another substrate. In such a case, it is desirable that the connection parts (external connection terminals) between the semiconductor device and user substrate be made of so-called high-temperature, lead-free solder.

For supplying solder onto the tops of the projected electrodes 3, a common, known solder supplying method can be employed such as, for example, solder leveler, paste printing, pin transfer, Super Juffit or ball shifting. In particular, when the tip ends of the projected electrodes are made flat, it is also easy to transfer balls directly onto the flat tops.

Further, the projected electrodes not formed thereon with solder and having flattened tip ends may be used as external connection terminals as they are, that is, as a so-called land grid array.

In the semiconductor device, solder bumps are formed on the tops of the projected electrodes and solder-connected to the substrate (user substrate (user substrate) via the solder bumps. Since the semiconductor device of the present embodiment has a stress relaxation structure, at the time of mounting the semiconductor device on the substrate, it is unnecessary to fill an underfill. When the user wants to secure an additional connection reliability between the semiconductor device and substrate, it goes without saying that the underfill can be filled.

According to the present embodiment, since the stress relaxation structure is formed as a projection discrete for each of the bumps, the stress relaxing action can be more effectively utilized. That is, the stress relaxation structures formed as the discrete projections have a section modulus smaller than that of the structure proposed in the first known example, and thus the amount of deformation can be set large. When compared with the projected structures proposed in the known examples 2 to 4, the present structure has parts of the stress relaxation structures not covered with the projected electrodes, whereby the stress acting on the bump solder can be reduced and the connection life of the bumps can be increased.

Even when hard and brittle Pb-free solder is used as the above solder, the connection reliability can be secured.

Further, when the stress relaxation structures are set to have a predetermined size, the semiconductor device can shield alpha rays from the solder bumps or external ultraviolet light.

How to Manufacture Semiconductor Device

How to manufacture a semiconductor device in accordance with the present embodiment will be explained below. FIGS. 2A to 2I show an example of how to form projected stress relaxation structures and projected electrodes.

First of all, as shown in FIG. 2A, a wafer, which a front-end process in semiconductor manufacturing has already be conducted or, is prepared. For simplification of the explanation, not the entire wafer but only a zone of the wafer corresponding to a single semiconductor element is extracted and illustrated as an example. It goes without saying that, in a so-called wafer-level chip-size package manufacturing process based on wafer collective processing to be explained later, this method can be also applied to processing of each of individual pieces cut out from the wafer.

As shown in FIG. 2B, next, projected stress relaxation structures 2 are formed on a surface protective film formed on the semiconductor element (which forming method will be explained later).

As shown in FIG. 2C, subsequently, a conductor layer to be formed as a plating seed film is formed by sputtering or the like, and then a resist film 2a is formed thereon to be lower (thinner) than the projected height of the stress relaxation structures 2. As a result, tops of the stress relaxation structures 2 are not covered with the resist, or even when the tops are covered therewith, the resist film becomes thin.

When a mesa-shaped stress relaxation structure is formed over a plurality of bumps as proposed in the first known example, it becomes necessary to form the resist film 2a thicker than the thickness of a wiring layer to be formed on the upper surface of the stress relaxation structure. As a result, there is a problem that it becomes difficult to pattern the resist on parts of the mesa-shaped stress relaxation structure corresponding to its root thereof. More specifically, at the time of forming a liquid-like resist film, the root of the mesa-shaped stress relaxation structure becomes thicker than the other parts, whereby defective development tends to occur. When a film-like rest previously formed to have a uniform thickness is used, on the other hand, the adhesion of the resist to the mesa-shaped stress relaxation structure becomes root of the lack and thus the resist at the root of the structure tends to be easily peeled off therefrom at the time of light exposure and development. In the present embodiment, the need for forming the resist on the tops of the stress relaxation structures 2 can be eliminated and the need for patterning the resist thereof can be also eliminated. Thus any of the above problems will not take place and a wide process margin can be secured, which results in that a yield can be improved and a semiconductor device manufacturing cost can be reduced.

In order to form a fine wiring layer similar to the surface protective layer even on the upper surface of the mesa-shaped stress relaxation structure, further, a light exposure equipment having an optical system larger in focal depth than the film thickness of the mesa-shaped stress relaxation structure is required. In the optical system of the light exposure equipment, generally speaking, as the focal depth is increased, a resolution decreases. Thus, when the upper and lower surfaces of such a mesa-shaped stress relaxation structure as proposed in the first known example are simultaneously exposed to light, it has its limit in forming the finer wiring. In the present embodiment, on the other hand, routing of the fine wiring on the projected upper parts becomes unnecessary and thus the resist on the projected tops of the stress relaxation structures 2 becomes unnecessary, with the result that resist thinner than the thickness of the stress relaxation structures 2 can be used. As a result, it becomes unnecessary for the light exposure equipment to have a large focal depth and thus a facility cost involved by manufacture of the semiconductor device can be reduced. In addition, the present embodiment can cope even with wiring finer than the structure proposed by the first known example.

Subsequently, as shown in FIG. 2D, the resist 2a is subjected to patterning operation in a photolithography step, and then Cu or the like is plated thereon into a pattern to form the projected electrodes 3 and wiring layers 4. In this example, since the projected electrodes 3 and wiring layers 4 are simultaneously formed, a photomask including these both patterns was used in the photolithography step. Since the tops of the stress relaxation structures 2 are projected from the top part of the resist, the plating is carried out so that the plated material covers the tops of the structure.

As shown in FIG. 2E, the resist is then peeled off and removed. FIG. 2F shows the stress relaxation structures 2, projected electrodes 3 and wiring layers 4 thus formed. In this case, since the projected electrodes 3 are sharply pointed, it is easy to secure electrical contact with the test device and the function and burn-in tests about the semiconductor element (semiconductor device) can be easily conducted. Further, even when the height of the electrodes varies, the height variations can be accommodated by the stress relaxation structures and stable contact can be obtained between the electrodes of the semiconductor element (semiconductor device) and the probe of the test device.

Then, as shown in FIG. 2G, a solder resist film is formed while leaving parts of the projected electrodes. In this case, the solder resist film may be formed by photolithography or by printing. A known common technique for forming a solder resist film can be employed.

Subsequently, as shown in FIG. 2H, solder bumps are formed to remaining parts of the projected electrodes. At this time, the wet solder wet solder spreads onto the entire surfaces of the parts of the projected electrodes not covered with the resist. After the solder bumps 8 are formed, the wafer is diced into a complete semiconductor device.

The semiconductor device is mounted on an assembly board (user substrate) via the solder bumps (FIG. 2I).

In accordance with the method of the present embodiment, since the thickness of the resist film 2a can be made smaller than the height of the projections, the focal depth of the light exposure equipment for use in the photolithography step can be suppressed to a low value.

Transmission of an electric signal to the semiconductor test device can be realized with use of the projected electrodes of the semiconductor device and thus the semiconductor device can be easily inspected.

When compared with the case where the stress relaxation layer is formed on the entire surface of the semiconductor device, the warpage of the semiconductor wafer (semiconductor device) can be reduced. Accordingly, in manufacturing a semiconductor device, wiring can be formed more accurately.

How to Form Stress Relaxation Structure

FIGS. 15 to 24 show methods for forming the stress relaxation structures 2. FIGS. 15A to 15C shows an example of forming a stress relaxation material using a mold of a pyramid shape, e.g., a quadrangular pyramid shape formed by silicon anisotropic etching. In these drawings, only a zone of a single semiconductor element is extracted from the wafer and illustrated for simplification of explanation, but processing steps are the same even for the entire wafer.

Figure 15A:
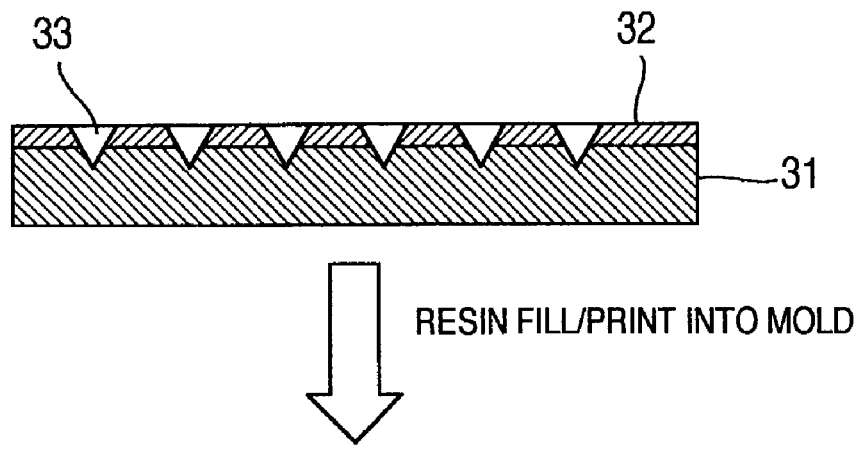
FIGS. 15A to 15C show a method for forming a projected stress relaxation structure with use of a mold formed by silicon anisotropic etching.
Figure 15B:
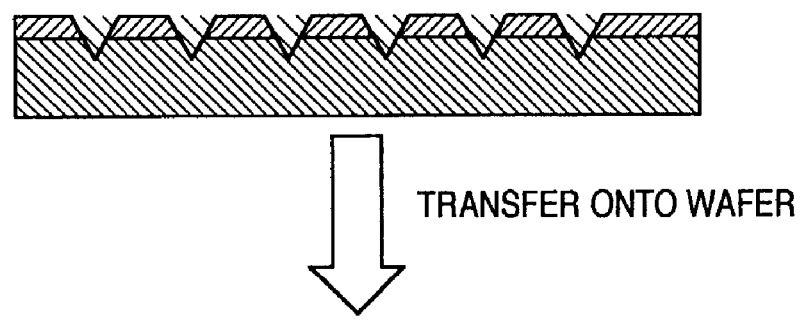
Figure 15C:
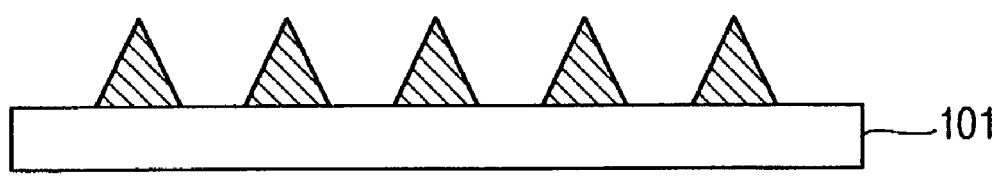

First, as shown in FIG. 15A, a silicon oxide film 32 is formed on a silicon substrate 31, and further rectangular openings are made in the oxide film utilizing the photolithography step. Then, the substrate is anisotropically etched through the openings to form quadrangular pyramid molds 33 in the silicon substrate 31. Next, as shown in FIG. 15B, stress relaxation material resin such as paste-like polyimide is printed and filled into the molds. In this connection, prior to the printing and filling operation, the surface of the substrate 31 including the molds 33 is preferably previously subjected to known common releasing operation. The quadrangular-pyramid-shaped stress relaxation material formed by the printing/filling operation is then transferred onto a semiconductor wafer 101 (FIG. 15C). In this connection, transfer has been carried out onto the wafer in the present embodiment. However, it goes without saying that each semiconductor element is cut out from the wafer and thereafter stress relaxation material may be transferred onto each element.

The features of this method lies in that (1) the molds are formed on the silicon substrate 31 with use of the photolithography step and (2) the molds and semiconductor element belong to an identical silicon substrate.

In this way, by using the photolithography step, the molds having a high positional accuracy and opening shape accuracy can be fabricated. Further, since the anisotropic etching of crystalline silicon to be dissolved according to the crystalline orientation of the silicon is carried out, the recess part of the molds has a high shape accuracy. In this method, the recess shape accuracy depends on the content of crystal defects included in the silicon substrate to be used. However, an inexpensive silicon substrate, which can be regarded as very low ratio in crystal defect and not contained practically perfectly, can be available. Thus when the positional accuracy and the opening shape accuracy at the photolithography step act in concert with the perfectness of inexpensive silicon substrate so as to yield a mold formation with high processing accuracy. In order to change the shape, it is only required to change the crystalline orientation of the silicon substrate, e.g., to change (100) to (110).

The thus-obtained stress relaxation material filled in the recessed parts of the molds cut on the silicon substrate is transferred onto the semiconductor element by joining the mold substrate to the wafer having the semiconductor element built therein. At this time, the mold and wafer have an identical coefficient of thermal expansion coefficient and vary by the same dimensional amount at the time of the transfer, which results in that the stress relaxation material can be transferred with a good positional accuracy.

Figure 16A:
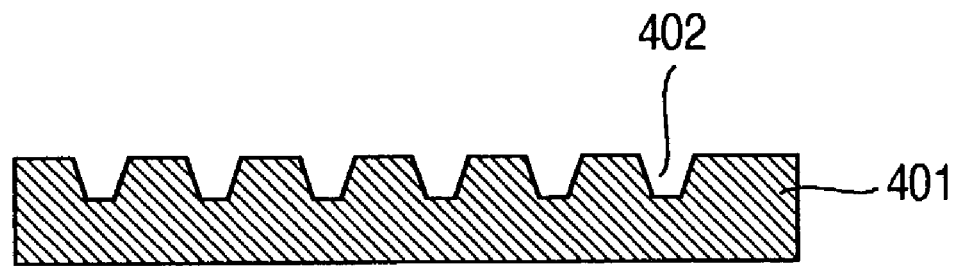
FIGS. 16A and 16B show a method for forming a projected stress relaxation structure with use of a die.
Figure 16A:
Figure 16B:
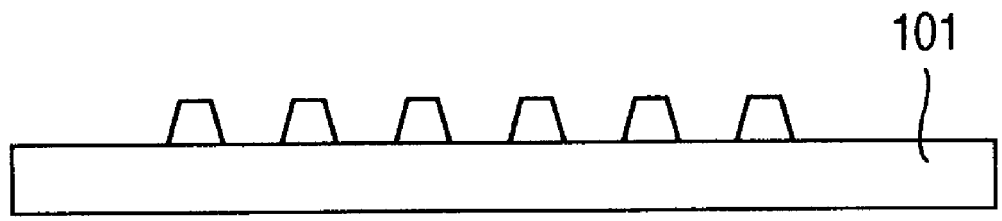
Figure 17A:
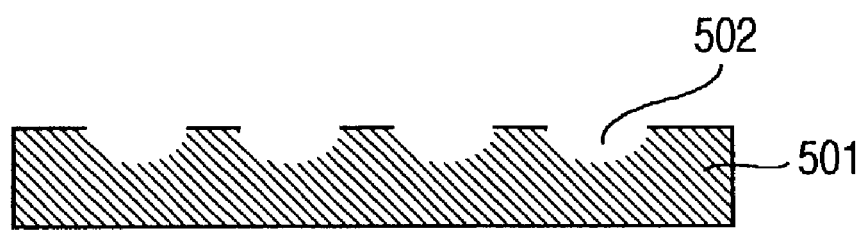
FIGS. 17A and 17B show a method for forming a projected stress relaxation structure with use of a die having hemispherical recesses formed therein.
Figure 17A:
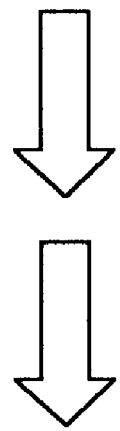
Figure 17B:

FIGS. 16A and 16B show an example of forming a stress relaxation material with use of a mold. As shown in FIG. 16A, a mold 401 having recesses 402 of, e.g. a truncated cone shape made by machining is first prepared. In this connection, the shape of the recess is not limited to the truncated cone shape but pyramid, truncated pyramid or hemisphere may be employed. For example, such a mold having nearly hemisphere-shaped recesses 502 as shown in FIGS. 17A and 17B can be transferred onto the semiconductor wafer 101 similarly to the present embodiment.

Next, as in the above case, resin such as paste-like polyimide is filled into the mold 401 and printed. Subsequently, the truncated-cone-shaped stress relaxation material formed by the filling and printing operation is transferred onto the wafer 101 having the semiconductor element built therein. With respect to the above machining method, press, etching, laser processing, discharge processing or caving can be employed to form a desired recess shape. The machining method can be selected depending on the material, demanded processing accuracy and processing cost of the mold. Since this method can avoid use of brittle material such as silicon, handling becomes easy. Further, since the photolithography step is not used, the mold can be manufactured inexpensively.

Figure 18A:
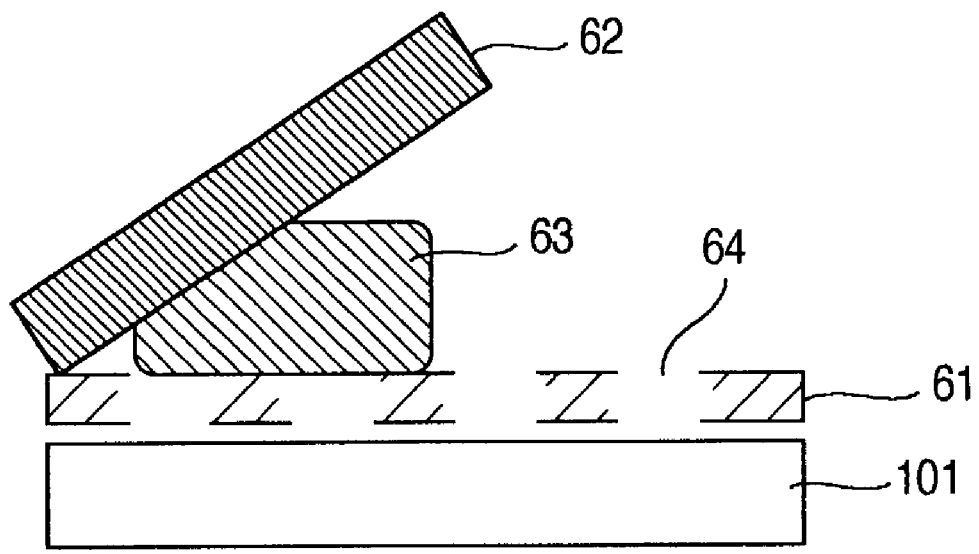
FIGS. 18A and 18B show a method for forming a projected stress relaxation structure by paste printing.
Figure 18B:
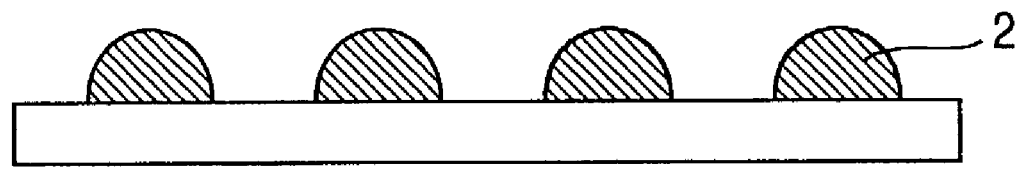

FIGS. 18A and 18B show an example of forming a stress relaxation structure by paste printing. First of all, as shown in FIG. 18A, a printing mask 61 is prepared, the printing mask 61 is contacted with a semiconductor wafer 101 in an aligned positional relationship, under which condition a squeegee 62 is moved along the surface of the printing mask 61. As a result, paste 63 put on the printing mask is filled into pattern openings of the mask 61. Next, as shown in FIG. 18B, when the printing mask 61 is removed, projected stress relaxation structures 2 are formed on a semiconductor wafer 60. In this connection, at the time of removing the printing mask 61, the mask 61 may be moved upwards or the wafer 101 may be moved downwards.

Figure 19A:
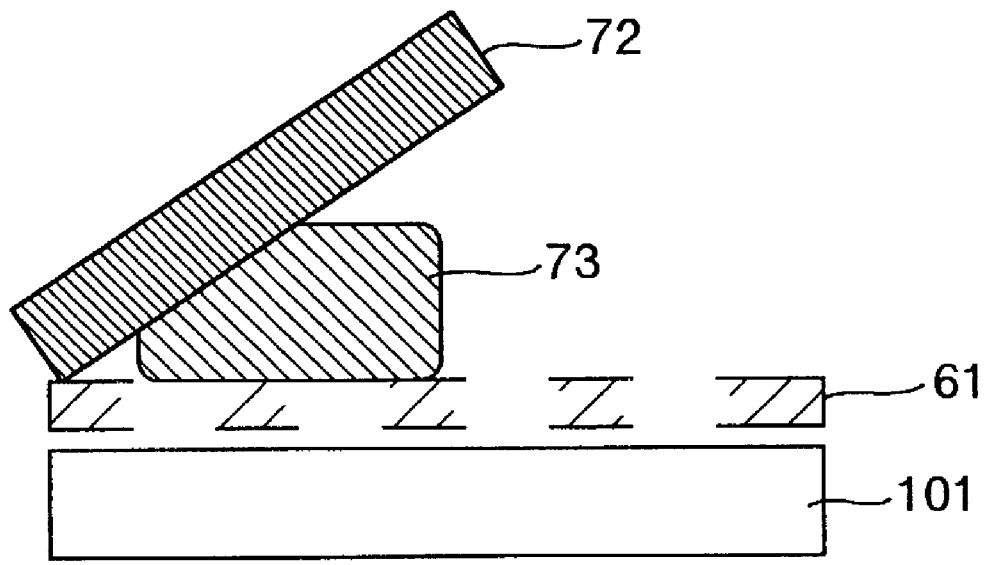
FIGS. 19A and 19B show another method for forming a projected stress relaxation structure by paste printing.
Figure 19B:
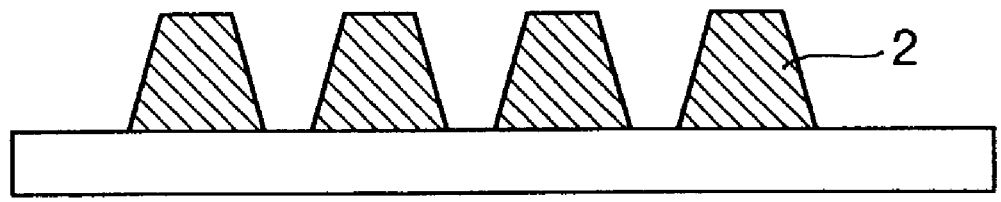

When such resin precursor with thermoplastic characteristic as to melt prior to thermosetting or thermoplastic resin is employed as the paste 63, such a stress relaxation structures 2 having nearly-hemispherical projections can be obtained as shown in FIGS. 18A and 18B. As shown in FIGS. 19A and 19B, such thermoplastic resin wax 73 as not be melt and to be able to be solidified by removing a solvent is used in place of such thermosetting resin 63 as to melt prior to thermosetting and then printed on the wafer 101, a stress relaxation structure having, e.g., nearly trapezoid-shaped projections corresponding to the opening shape of the printing mask can be obtained.

Figure 20A:
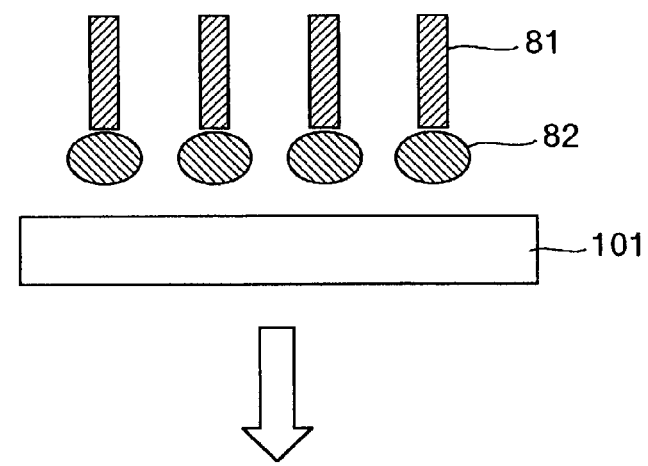
FIGS. 20A and 20B show a method for forming a projected stress relaxation structure by pin transfer printing.
Figure 20B:
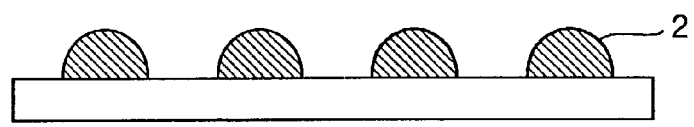

FIGS. 20A and 20B show an example of forming a stress relaxation structure based on pin transfer printing. First, as shown in FIG. 20A, resin 82 is attached to tip ends of a plurality of pins 81, under which condition the pins 81 are moved closer to the upper surface of a wafer 101 having the semiconductor element built therein to transfer the attached resin 82 onto the wafer 101. As shown in FIG. 20B, next, when the pins 81 are moved upwards or the wafer 101 is moved downwards for its removal, a stress relaxation structure 2 having projections formed on the semiconductor wafer 101 can be obtained. In this connection, when an ink jet device or the like is used in place of the pin transfer printing to eject the stress relaxation material onto the wafer 101 and to form projected stress relaxation structures 2 thereon.

When such a manufacturing method as to use the mold or printing mask is used as shown in FIGS. 15 to 19, it is necessary to prepare the mold or printing mask for each of the sorts of products. And when the mold or mask was defective or damaged, it becomes necessary to newly make it. However, when the mold or mask having a desired pattern is prepared, desired stress relaxation structures 2 can be formed reliably, conveniently and quickly. Further, by using the mold or printing mask repetitively, the cost of manufacturing the mold or printing mask per semiconductor element can be made small.

When a method not using a mold as exemplified in FIGS. 20A and 20B, this takes troublesomely a lot of time in positioning or it is not always to ease the shape control of the stress relaxation structures 2. However, this method can eliminate the necessity for troublesome processing of the mold or printing mask. Thus, taking such features into consideration, you can select suitable one of these manufacturing methods according to a product to be applied or its application.

Figure 21A:
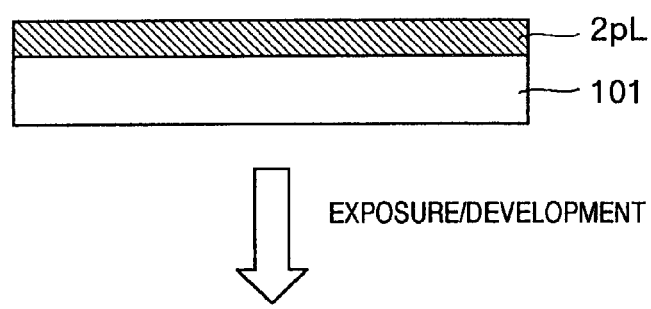
FIGS. 21A and 21B show a method for forming a projected stress relaxation structure with use of a photolithography step.
Figure 21B:
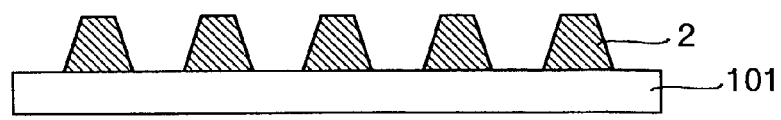

FIGS. 21A and 21B show an example of forming a stress relaxation structure by a photolithography step. First of all, as shown in FIG. 21A, a photosensitive stress relaxation material layer $2pL$ is formed on a wafer 101 having a semiconductor element built therein. At the time of forming the layer $2pL$, if the stress relaxation material is in its liquid state, then the layer can be formed by a spin coating, curtain coating or the like method. When the stress relaxation material is in the form of a sheet, sheet laminating method can be employed for the layer. Subsequently, a lithography or exposure mask is placed on the stress relaxation layer $2pL$, the photosensitive layer $2pL$ is subjected to light exposing through the mask and then developing operation. FIG. 21B shows the semiconductor wafer 101 after exposed and developed and the projected stress relaxation structures 2 formed on the wafer. In this example, since the photosensitive stress relaxation material layer $2pL$ is used, the price of the stress relaxation material tends to become higher than non-photosensitive material. However, since the photolithography step is employed, the obtained stress relaxation structure can have a high positional accuracy and shape accuracy. In this conjunction, in the method for forming the molds using the photolithography step exemplified in FIGS. 15A to 15C, the shape transfer from the photomask is carried out in two stages (photomask→mold→wafer); whereas, in the method exemplified in FIGS. 21A and 21B, the shape transfer is carried out in one stage. For this reason, the method exemplified in FIGS. 21A and 21B tends to be higher in positional accuracy and shape accuracy than the method exemplified in FIGS. 15A to 15C.

Figure 22A:
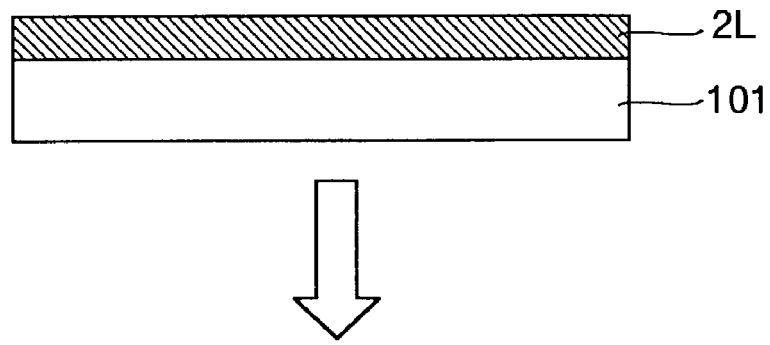
FIGS. 22A to 22C show another method for forming a projected stress relaxation structure with use of the photolithography step.
Figure 22B:
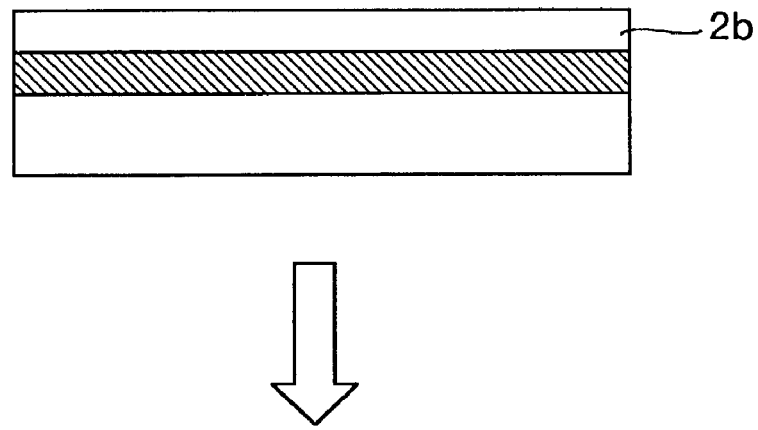
Figure 22C:

FIGS. 22A to 22C show another example of forming a stress relaxation material using a photolithography step.

First of all, as shown in FIG. 22A, a non-photosensitive stress relaxation material layer 2L is formed on a wafer 101 having a semiconductor element formed thereon. At the time of forming the layer 2L, a method similar to the example of FIGS. 21A and 21B can be employed. As shown in FIG. 22B, next, an etching resist film $2b$ is formed on the formed stress relaxation material layer 2L. Even for the method for forming the etching resist film, a known common film forming method such as spin coating, curtain coating or sheet laminating can be used. Subsequently, the resist film is subjected to light exposing with use of an exposure mask, and developing operation and then, will use of the above mentioned developed resin, the stress relaxation material layer 2L is etched so as to be patterned. For the etching, dry etching or wet etching can be employed. Thereafter, after the resist is removed, such a stress relaxation structures 2 as shown in FIG. 22C is obtained.

The method exemplified in FIGS. 22A to 22C requires two film forming steps and thus the number of steps in FIGS. 22A to 22C becomes larger than that in FIGS. 21A and 21B. However, since the non-photosensitive stress relaxation material layer 2L and a known common etching resist can be combined and used, the material cost of the method of FIGS. 22A to 22C can be made lower than that of the method of FIGS. 21A and 21B using the photosensitive stress relaxation layer $2pL$. In addition, the method of FIGS. 22A to 22C can exhibit a positional accuracy and shape accuracy compatible with the method of FIGS. 21A and 21B.

Figure 23A:
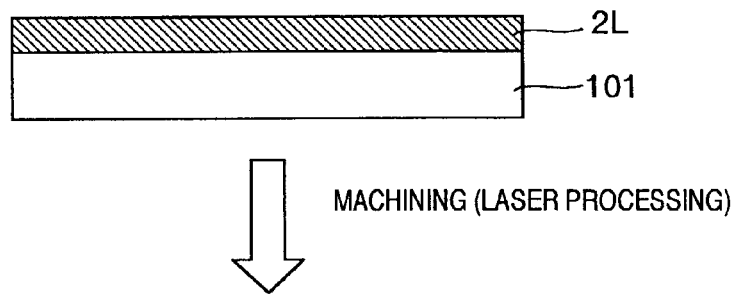
FIGS. 23A and 23B show a further method for forming a projected stress relaxation structure.
Figure 23B:
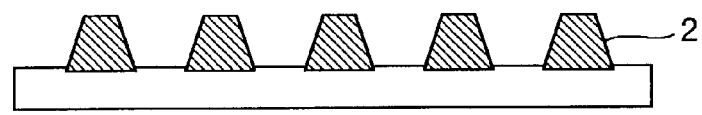

FIGS. 23A and 23B show a further example of forming a projected stress relaxation structures 2. As shown in FIG. 23A, first of all, a non-photosensitive stress relaxation material layer 2L is formed on a wafer 101 having a semiconductor element formed therein. At the time of forming the layer 2L, a method similar to the method used in FIGS. 21A and 21B or 22A to 22C can be employed. As shown in FIG. 23B, next, the non-photosensitive stress relaxation material layer 2L is processed by machining such as laser processing or the like to form, e.g., trapezoid-shaped stress relaxation structures 2. In this forming method, it is unnecessary for the stress relaxation material to be photosensitive. Since the need for previously preparing a mold or photomask can be eliminated, a time (manufacturing lead time) taken until the manufacture of the semiconductor element can be started can be shortened.

Figure 24A:
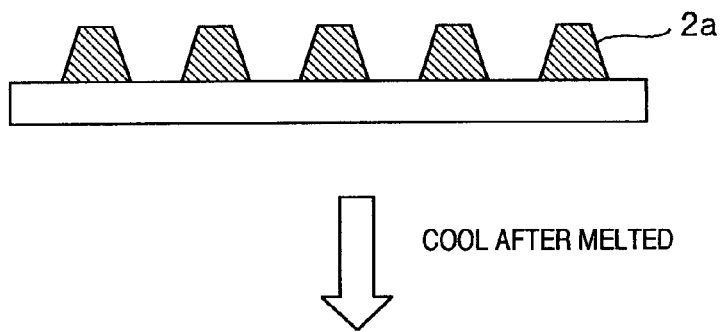
FIGS. 24A and 24B show an example of changing the shape of the stress relaxation material once formed.
Figure 24B:
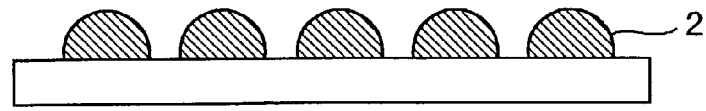

FIGS. 24A and 24B show an example of modifying the shape of a stress relaxation material once formed. As shown in FIG. 24A, first of all, a stress relaxation material layer $2a$ is formed on a wafer 101. At the time of forming the layer $2a$, a mold transfer can be carried out by a mold transfer, printing or photolithographical method. More specifically it can be realized by using the method exemplified in FIGS. 15 to 23. As shown in FIG. 24B, next, the layer $2a$ is heated and melted, and the cooled and solidified. As a result, a stress relaxation structure having hemisphere-shaped projections can be obtained. As the stress relaxation material, thermoplastic resin or the like can be employed.

Figure 25:
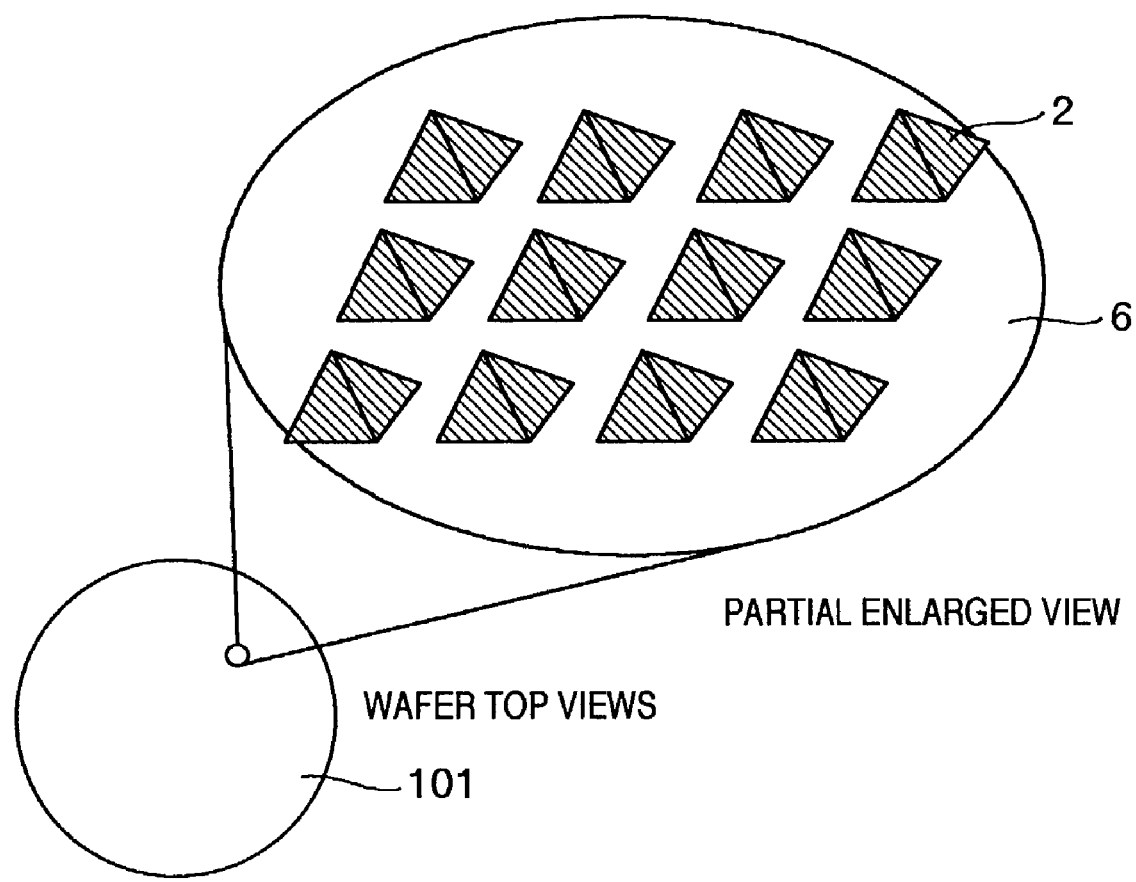
FIG. 25 is a view when the state of a wafer having a stress relaxation structure formed thereon is observed obliquely from above.

FIG. 25 is a view when a wafer having stress relaxation structures formed thereon is obliquely observed. As shown in FIG. 25, a surface protective film 6 made of a passivation film or the like is provided on the entire surface of a wafer 101, and a plurality of projected stress relaxation structures 2 are further formed on the entire surface of the surface protective film 6. For simplification of the drawing, stress relaxation structures are illustrated as enlarged in FIG. 25.

FIGS. 26 to 29 show typical methods of manufacturing a semiconductor package (semiconductor device) having independent projected stress relaxation structures.

Figure 26A:
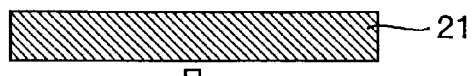
FIGS. 26A to 26G show a method for manufacturing a semiconductor package having a stress relaxation structure.
Figure 26B:
Figure 26C:

Explanation will first be made sequentially in connection with firstly FIGS. 26A to 26G. As shown in FIG. 26A, a silicon substrate 21 is prepared. As shown in FIG. 26B, next, the silicon substrate 21 is anisotropically etched in such a manner as mentioned above to form a mold having pyramid-shaped recesses. Subsequently, the surface of the mold is processed by a known common method such as sputtering or plating to form a conductive layer 22 of, e.g., copper. Further, varnish 23 as the stress relaxation material is filled into the recesses and solidified. During the solidification of the varnish, volume shrinkage takes place in such a manner that the stress relaxation material sinks to the lower part of each recess and the varnish has a nearly volcanic-cone-shaped surface. Then a resist film is formed on the entire surface of the substrate and subjected to patterning operation by a known common method such as photolithography, and thereafter the conductive layer 22 is etched into a pattern with use of the resist as a mask to form projected electrodes 3 and wiring layers 4 as shown in FIG. 26C. The thickness of the resist film to be formed at this time may be set to correspond to the volume shrinkage of the varnish. For this reason, when the resist is patterned by photolithography, it is suffice even when the focal depth of the light exposure equipment used in the light exposure step is smaller than the desired thickness of the stress relaxation structures. When the stress relaxation material is shrunk during the solidification, it is required to add stress relaxation material corresponding to the shrinkage amount as necessary.

Figure 26D:
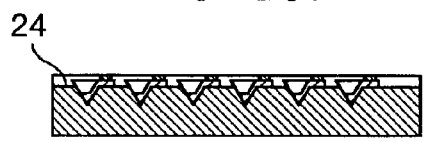
Figure 26E:
Figure 26F:
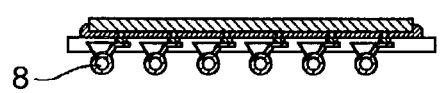
Figure 26G:
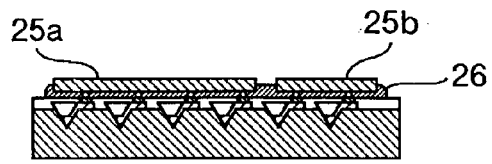

Next, as shown in FIG. 26D, an insulating layer of, e.g., polyimide is formed. That is, at least one of the conductive layer of copper and at least one of the insulating layer of polyimide are laminated each by one or more layers to form a wiring layer (polyimide/copper wiring layer) 24. As shown in FIG. 14E, a semiconductor element 25 having, e.g., gold bumps is mounted and joined onto the wiring layer 24, and further a space between the wiring layer 24 and semiconductor element 25 is filled with resin 26 having a high stiffness. Though gold bumps were used at the joint part of the semiconductor element 25 in this example, a known common connection member can be used. The resin is called underfill which has an effect of reinforcing the connection part. Subsequently, as shown in FIG. 26F, the projected electrodes and wiring layer 24 are separated from the silicon substrate 21, and then solder bumps 8 are formed at tip ends of the projected electrodes to thereby obtain a semiconductor device (semiconductor package). In this connection, the formation of the solder bumps is omitted and a so-called land grid array may be used without any problem. As shown in FIG. 26G, it is also allowed to mount and join a plurality of semiconductor elements (for example, elements 25a and 25b) to the substrate to form a multi-chip package.

Figure 27A:
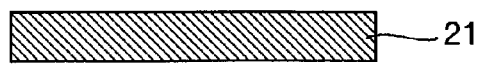
FIGS. 27A to 27G shows another method for manufacturing a semiconductor package having a stress relaxation structure.
Figure 27A:
Figure 27B:
Figure 27B:
Figure 27C:
Figure 27C:
Figure 27D:
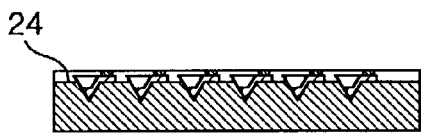
Figure 27D:
Figure 27E:
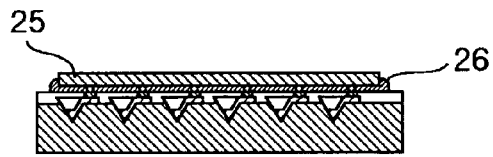
Figure 27E:
Figure 27F:
Figure 27G:
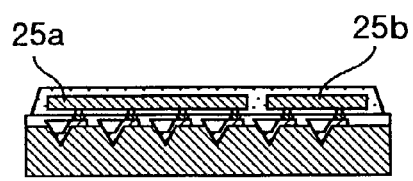

FIGS. 27A to 27G show another example of manufacturing a package having a stress relaxation structure having discrete projections. In this connection, since the processing carried in FIGS. 27A to 27E is the same as that in FIGS. 26A to 26G, explanation thereof is omitted. In the method of the drawings, after the semiconductor element is processed as shown in FIG. 27E, the semiconductor element is molded with resin 27 as shown in FIG. 27F. Thereafter, the projected electrodes 3 and wiring layer 24 are released from the silicon substrate 21, and solder bumps 8 are formed at the tip ends of the projected electrodes, thus forming a semiconductor device (semiconductor package). Even in this case, the formation of the solder bumps can be omitted and a so-called land grid array can be used instead, without any problem. As shown in FIG. 27G, further, a plurality of semiconductor elements (for example, elements 25a and 25b) may be mounted and joined into a multi-chip package, an underfill 26 may be omitted, and only the molding resin 27 may be used.

FIGS. 28A to 28G show a further method of manufacturing a multi-chip package having a stress relaxation structure having discrete projections. Since processing to be carried out in FIGS. 28A to 28D is basically the same as that carried out in FIGS. 26A to 26G, detailed explanation thereof is omitted.

The manufacturing method exemplified in FIGS. 28A to 28G is different from the manufacturing method exemplified in FIGS. 26A to 26G in the number of films in the wiring layer. That is, the polyimide/copper wiring layer 24 was made up of a single film in FIGS. 26A to 26G, while the layer is made up of three films (films 24a, 24b and 24c) in FIGS. 28A to 28G. Although the wiring layer 24 has been made up of three film in the present embodiment, the number of such films may be set at a desired value.

Figure 28A:
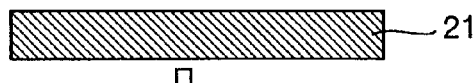
FIGS. 28A to 28G a further method for manufacturing a semiconductor package having a stress relaxation structure.
Figure 28B:
Figure 28C:
Figure 28D:
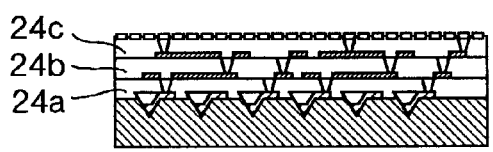
Figure 28E:
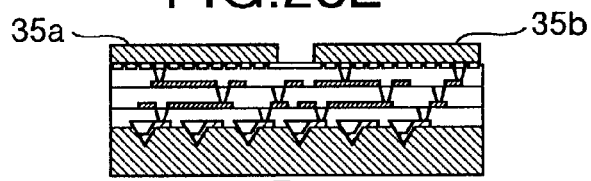
Figure 28F:
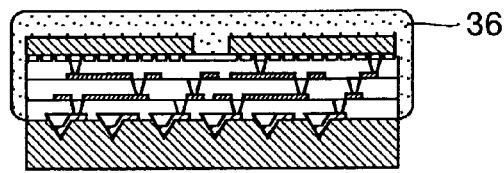
Figure 28G:
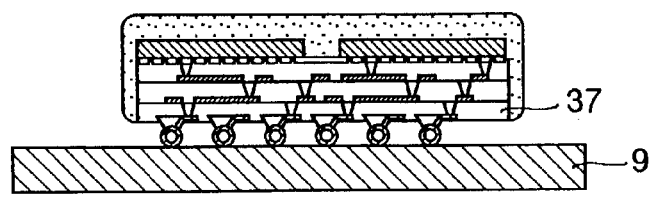

Though the surfaces of connection pads on which a semiconductor chip is mounted at an uppermost wiring layer 24c are plated with, e.g., tin (Sn) in the present embodiment, the surfaces of the pads can be subjected to pad surface treatment by a known common method. For example, the pad surfaces can be plated with gold (Au) or can be printed with Sn paste. As shown in FIG. 28E, next, a plurality of semiconductor chips 35a and 35b are mounted on the substrate so that Au—Sn or Au—Au joint causes the chips 35a and 35b to be connected to the uppermost wiring layer. In this connection, depending on the applications, the number of such semiconductor chips may be more than 2, a joining method other than the Au—Sn or Au—Au joint may be employed as the method for joining the chips and wiring layer. Subsequently, as shown in FIG. 28F, the plurality of wiring layers and the plurality of semiconductor chips are molded with resin 36. A multi-chip package 37 thus formed is released from the silicon substrate 21, and thereafter solder bumps are formed at the tip ends of the projected electrodes to form a multi-chip package 37 with the bumps. The multi-chip package is built in electronic equipment with a condition that the package is mounted on a board (motherboard) 9 as shown in FIG. 28G. Electronic equipment for suitable use of the multi-chip package 37 includes, for example, a portable telephone set, a personal digital assistance (PDA) or notebook personal computer.

Figure 29A:
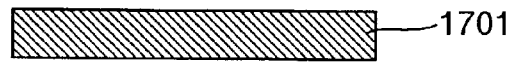
FIGS. 29A to 29G show yet another method for manufacturing a semiconductor package having a stress relaxation structure.
Figure 29B:
Figure 29C:
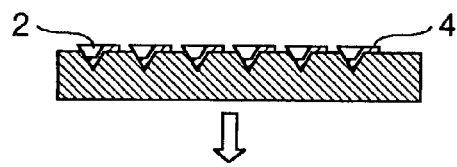
Figure 29D:
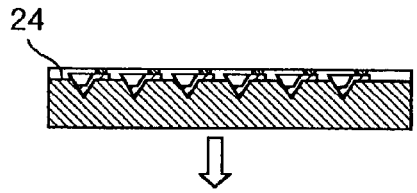
Figure 29E:
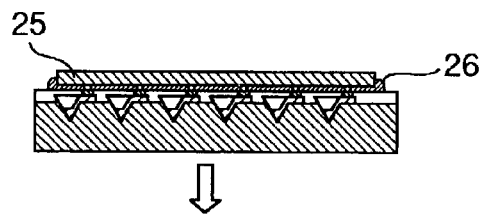
Figure 29F:
Figure 29G:
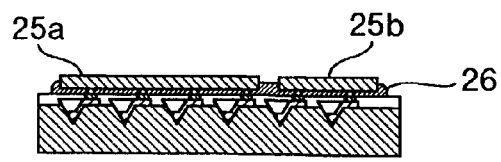

FIGS. 29A to 29G show a further example of manufacturing a package having a stress relaxation material having discrete projections. As shown in FIG. 29A, first of all, a metallic plate 1701 is prepared and, for example, machined to make recesses therein. The recesses may have a truncated pyramid or hemisphere shape without any problem, so long as the recesses can be processed into such a shape. Next, as shown in FIG. 29B, a metallic foil 1702 of copper or the like as a wiring conductor is formed on the metallic plate. The formation of the metallic foil may be carried out by a known common method, for example, by sputtering, CVD or plating. Subsequently, as shown in FIG. 29C, resin varnish such as paste-like polyimide is filled into the mold, printed, and then solidified. Subsequently, a resist film is formed on the entire surface of the plate, patterned by a known common method such as photolithography, and then the metallic foil 1702 is etched into a pattern with use of the resist as a mask to form projected electrodes and wiring layers. A structure having thus-projected electrodes 3 and the wiring layers 4 formed on the metallic plate 1701 can be obtained. Steps of FIGS. 29D to 29F after the above steps are similar to those of FIGS. 26D to 26F, and therefore detailed explanation thereof is omitted. A difference between FIGS. 26 and 29 lies in that the metallic plate 1701 is used as a plating seed film for plating as mentioned above. According to this method, film formation can be attained inexpensively and easily.

Figure 30:
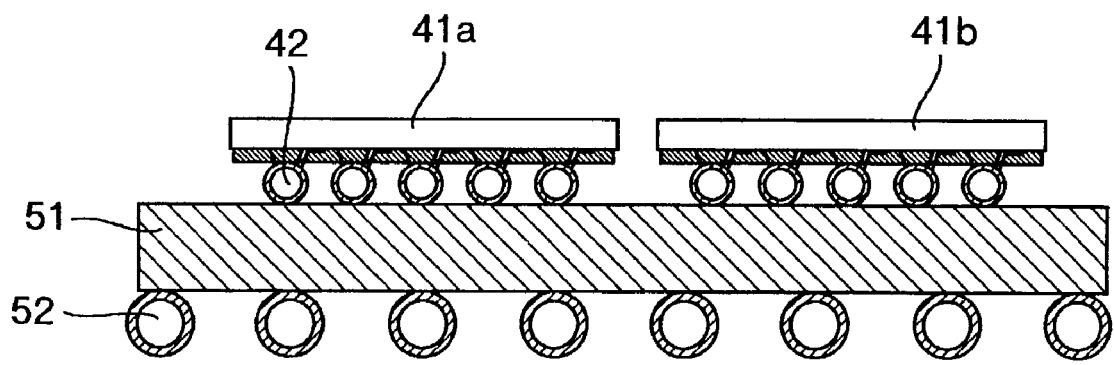
FIG. 30 shows a structural example wherein a semiconductor device having a stress relaxation structure is mounted on a multi-layered substrate.

FIG. 30 shows a structural example wherein at least two of semiconductor devices 41 including a stress relaxation material having the discrete projections manufactured, e.g., by the methods exemplified in FIGS. 26 to 29, that is, semiconductor devices 41a and 41b in this example are mounted on a multilayered wiring substrate 51. The packages 41a and 41b are soldered to the substrate 51 by means of Pb-free solder (lead-free solder 42) of a high temperature type (having a melting point of 230–300° C.). In particular, since the high-temperature Pb-free solder is hard and brittle, it is difficult to secure a sufficient connection life in a general module structure. In the structure of the present embodiment, however, solder bumps has stress relaxation structures at their root parts and a thermal stress can be lightened by deformation of the stress relaxation structure, whereby a sufficient connection life can be secured. Meanwhile, the substrate 51 is soldered to another substrate (not shown) by means of Pb-free solder (lead-free solder) 52 of a low temperature type (having a melting point not larger than 200° C.) or of a medium temperature type (having a melting point of 200–230° C.). In order that the solder 48 is prevented from again melting at a reflow temperature the substrate 51 when the substrate 51 is soldered to another substrate with use of the low or medium temperature Pb-free solder (lead-free solder) 52, a difference in melting point between the solders 48 and 52 is required to be not smaller than 30° C. To this end, as an specific example of the solder 42, Au—20 mass % Sn (having a melting point of 280° C.) can be used. Further, as a specific example of the solder 52, Sn—2% Ag—7.5% Bi—0.5% Cu (having a liquidus line temperature of 211° C.) can be used.

As has been mentioned above, when the structure exemplified, e.g., in FIGS. 18A and 18B is formed using the technique of the present application, there can be manufactured a multi-chip module which can have a temperature hierarchy with a high connection reliability while eliminating the need for use of Pb-contained solder.

Although the projected electrodes have been arranged respectively discrete one for each of the projections on the stress relaxation structure in the above explanation, plural ones of the projected electrodes and plural ones of the wiring layers can also be arranged for one of the projections on the stress relaxation structure.

As has been explained in the foregoing, the foregoing embodiments can have at least any of effects which follow.

(1) Since the stress relaxation structure can be formed with respectively discrete projections, for example, each for each bump, the structure can be effectively used due to its stress relaxing action. That is, the stress relaxation structure having the discrete projections formed thereon, which is smaller in section modulus than the wafer-level chip-size package proposed in the first known example, can set its deformation amount large. Accordingly, a stress acting on the bump solder can be reduced and thus its conductive layer can be prolonged. Further, as the solder, the hard and brittle Pb-free solder can be used. Furthermore, since the height of the stress relaxation material having an alpha ray shielding function can be set large, the alpha ray shielding function can be increased.

(2) Since each of the wiring layers can be provided for each of the discrete projections formed on the stress relaxation structure, the wiring layer provided on each projection of the stress relaxation material can be principally one. For this reason, at the time of forming the wiring layer, the need for use of a light exposure equipment having a high resolution and a wide focal depth can be eliminated. Further, since a process margin is increased, its manufacturing steps can be simplified.

(3) The projected electrodes are provided on the stress relaxation structure so as to cover nearly half of the upper surface thereof. In other words, since nearly half of the lower surface of the stress relaxation structure is not covered with the less-resilient projected electrodes, its stress relaxing action can be utilized more effectively.

(4) At the time of forming the stress relaxation structure, the photolithography step can be employed. Therefore, the element can be made small in size and the number of terminals thereof can be increased, as advantages.

(5) The wiring layer can be formed on the surface protective film. Since the surface protective film (passivation film) is highly flat, the wiring layer formed on the protective film can be formed in fine lines, whereby the element can be made small in size and the number of terminals thereof can be increased, as advantages.

(6) The discrete projections of the stress relaxation structure can be arranged on the entire surface of the semiconductor element. As a result, the wiring layers can be formed in fine lines as shown in FIG. 1, thus advantageously realizing a small element size or an increased number of terminals.

Since the wider parts of the wiring layers provided for prevention of disconnection of the wiring layers can be limited only to the rising parts of the projected stress relaxation structure, the size of the semiconductor device can be made small or the number of terminals can be increased advantageously.

(7) The tip ends of the projected electrodes covering the top of the projected stress relaxation structure can be sharpened into, e.g., a pyramid shape. The projected electrodes having such sharp tip ends can keep good contact with a probe (contact terminals) of a function inspection device. Further, the need for sharpening the tip end of the probe of the function inspection device is eliminated and thus the life of the probe can be prolonged.

As has been explained in the foregoing, in accordance with the present invention, a semiconductor device having an improved connection reliability can be provided.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A semiconductor device comprising a semiconductor chip having element electrodes which are distributed at selected locations on substantially an entire surface of the semiconductor chip, said element electrodes being spread along a first direction and a second direction transverse to the first direction;

an insulating film formed on said semiconductor chip so as to cover a side of each of the element electrodes and to expose at least a partial area of each of said element electrodes;

a plurality of the discrete projected stress relaxation materials formed on said insulating film;

projected electrodes covering at least portions of tops of said stress relaxation materials, which projected electrodes are positioned at selected locations of substantially the entire surface on the semiconductor chip;

wiring lines to electrically connect the projected electrodes to connection electrodes; and solder bumps respectively formed on each of projected electrodes, wherein each of the projected electrodes is shifted to the same position relative to a corresponding one of the element electrodes connected thereto by a corresponding one of the wiring lines in the first and second directions in the surface of the semiconductor chip as each of the other projected electrodes relative to the corresponding element electrode connected thereto so that the each of the projected electrodes, the corresponding element electrodes connected thereto and the corresponding wiring layers are arranged side-by-side to reduce a length of the respective wiring lines connecting the projected electrodes to the corresponding element electrodes.

2. A semiconductor device according to claim 1, wherein a pitch between the solder bumps is substantially the same for the plurality of projected electrodes positioned on substantially the entire surface of the semiconductor chip.

3. A semiconductor device according to claim 1, wherein said wiring lines electrically connecting the projected electrodes to the element electrodes each have substantially the same length.

4. A semiconductor device according to claim 2, wherein said wiring lines electrically connecting the projected electrodes to the element electrodes each have substantially the same length.

5. A semiconductor device according to claim 1, wherein said wiring layers are arranged to extend in a direction which is diagonal to the first and second directions, and wherein each of said wiring layers is substantially parallel to wiring layers adjacent thereto.

6. A semiconductor device according to claim 2, wherein said wiring layers are arranged to extend in a direction which is diagonal to the first and second directions, and wherein each of said wiring layers is substantially parallel to wiring layers adjacent thereto.

7. A semiconductor device according to claim 3, wherein said wiring layers are arranged to extend in a direction which is diagonal to the first and second directions, and wherein each of said wiring layers is substantially parallel to wiring layers adjacent thereto.

8. A semiconductor device according to claim 4, wherein said wiring layers are arranged to extend in a direction which is diagonal to the first and second directions, and wherein each of said wiring layers is substantially parallel to wiring layers adjacent thereto.

9. A semiconductor device comprising:
a semiconductor chip having element electrodes;
a first insulating film formed on said semiconductor chip so as to cover a side of each of said element electrodes;
first connection electrodes formed vertically directly above said element electrodes and on said first insulating film, wherein each of which first connection electrodes is connected directly to one of the element electrodes;
second connection electrodes formed on a position dislocated from the position of the element electrodes, which second connection electrodes are connected to the element electrodes via wiring lines, the first connection electrodes, and via holes;
a second insulating film formed above said first insulating film;
third connection electrodes formed vertically directly above said element electrodes and on the said second insulating film, wherein each of said third connection electrode is connected to one of the element electrodes through via holes, without said wiring lines being interposed between the third connection electrodes and the element electrodes;
fourth connection electrodes formed vertically directly above said second connection electrode, wherein each of said fourth connection electrodes is connected to the second connection electrode through via holes, without said wiring lines being interposed between the fourth connection electrodes and the second connection electrodes,
a plurality of the discrete projected stress relaxation structures comprised of the stress relaxation material formed on said insulating film;
projected electrodes respectively covering at least portions of tops of said structures stress relaxation structures; and
wiring lines to electrically connect the projected electrodes to the third and fourth connection electrodes.

10. The semiconductor device as set forth in claim 9, wherein said projected electrodes cover nearly half of upper parts of said projected stress relaxation structures.

11. The semiconductor device as set forth in claim 9, wherein parts of said wiring lines are formed on slant parts of said stress relaxation structures.

12. The semiconductor device as set forth in claim 9, wherein said wiring lines are formed wider at rising parts of said projected stress relaxation structures.

13. The semiconductor device as set forth in claim 9, wherein said wiring lines have at least two sorts of wiring lines having different wiring line widths.

14. The semiconductor device as set forth in claim 9, wherein said projected stress relaxation materials have a nearly trapezoid shape.

15. The semiconductor device as set forth in claim 9, wherein said projected stress relaxation materials have a nearly hemisphere shape.

16. A mounting structure including the semiconductor device set forth in claim 9 and a substrate on which the semiconductor device is mounted.

17. A mounting structure including a plurality of semiconductor devices and a substrate on which the plurality of semiconductor devices are mounted, wherein at least one of said plurality of semiconductor devices is the semiconductor device set forth in claim 9.

18. The semiconductor devices comprising a semiconductor chip having element electrodes,
an insulating film formed on said semiconductor chip so as to cover a side of each of the element electrodes and to expose at least a partial area of each of the electrodes;
a plurality of projected stress relaxation materials formed on said insulating film and having low elastic moduli, a high heat resistance and a coefficient of thermal expansion in a range of 3 ppm–300 ppm,
project electrodes covering at least portions of tops of said stress relaxation materials; and
wiring lines to electrically connect the projected electrodes and the element electrodes of the semiconductor chip, and
wherein the semiconductor chip has a semiconductor wafer, and
wherein the projected stress relaxation materials are formed of a resin material having an elastic modulus smaller than that of the semiconductor wafer; and
wherein the elastic modulus of the projected stress relaxation materials is in a range of 0.1 Gpa–20 Gpa.

19. The semiconductor device as set forth in claim 18, wherein said projected stress relaxation materials have a coefficient of thermal expansion in a range of 3 ppm–200 ppm.

20. The semiconductor device as set forth in claim 19, wherein said projected stress relaxation materials have a coefficient of thermal expansion in a range of 3 ppm–150 ppm.

21. The semiconductor devices as set forth in claim 18, wherein
the projected stress relaxation materials are formed of paste-like polyimide, modified amidoimide resin, or ester imide resin.

22. The semiconductor devices comprising a semiconductor chip having element electrodes, wherein
an insulating film formed on said semiconductor chip so as to cover a side of each of the element electrodes and to expose at least a partial area of each of the electrodes;
a plurality of projected stress relaxation materials formed on said insulating film and having low elastic moduli, a high heat resistance and a coefficient of thermal expansion in a range of 3 ppm–300 ppm,
project electrodes covering at least portions of tops of said stress relaxation materials; and
wiring lines to electrically connect the proiected electrodes and the element electrodes of the semiconductor chip, and
wherein the semiconductor chip has a semiconductor wafer, and
wherein the projected stress relaxation materials are formed of a resin material having an elastic modulus smaller than that of the semiconductor wafer; and
wherein, the elastic modulus of the projected stress relaxation materials is not larger than 10 Gpa at room temperature.

23. The semiconductor device as set forth in claim 22, wherein said projected stress relaxation materials have a coefficient of thermal expansion in a range of 3 ppm–200 ppm.

24. The semiconductor device as set forth in claim 23, wherein said projected stress relaxation materials have a coefficient of thermal expansion in a range of 3 ppm–150 ppm.

25. The semiconductor device as set forth in claim 22, wherein the projected stress relaxation materials are formed of paste-like polyimide, modified amidoimide resin, or ester imide resin.

26. The semiconductor devices comprising a semiconductor chip having element electrodes, wherein
an insulating film formed on said semiconductor chip so as to cover a side of each of the element electrodes and to expose at least a partial area of each of the electrodes;
a plurality of proiected stress relaxation materials formed on said insulating film and having low elastic moduli, a high heat resistance and a coefficient of thermal expansion in a range of 3 ppm–300 ppm,
project electrodes covering at least portions of tops of said stress relaxation materials; and
wiring lines to electrically connect the projected electrodes and the element electrodes of the semiconductor chip,
wherein curing temperature of the projected stress relaxation materials is in a range from 100° C. to 250° C.

27. The semiconductor device as set forth in claim 26, wherein said projected stress relaxation materials have a coefficient of thermal expansion in a range of 3 ppm–200 ppm.

28. The semiconductor device as set forth in claim 27, wherein said projected stress relaxation materials have a coefficient of thermal expansion in a range of 3 ppm–150 ppm.

29. The semiconductor devices as set forth in claim 26, wherein
the projected stress relaxation materials are formed of paste-like polyimide, modified amidoimide resin, or ester imide resin.

30. The semiconductor device as set forth in claim 26, wherein said projected stress relaxation materials have a coefficient of thermal expansion in a range of 3 ppm–200 ppm.

31. The semiconductor device as set forth in claim 30, wherein said projected stress relaxation materials have a coefficient of thermal expansion in a range of 3 ppm–150 ppm.

32. The semiconductor devices as set forth in claim 26, wherein the projected stress relaxation materials are formed of paste-like polyimide, modified amidoimide resin, or ester imide resin.

33. The semiconductor devices comprising a semiconductor chip having element electrodes, wherein
an insulating film formed on said semiconductor chip so as to cover a side of each of the element electrodes and to expose at least a partial area of each of the electrodes;
a plurality of proiected stress relaxation materials formed on said insulating film and having low elastic moduli, a high heat resistance and a coefficient of thermal expansion in a range of 3 ppm–300 ppm,
project electrodes covering at least portions of tops of said stress relaxation materials; and
wiring lines to electrically connect the proiected electrodes and the element electrodes of the semiconductor chip,
wherein pyrolysis decomposing temperature of the projected stress relaxation materials is not lower than about 300° C.

34. The semiconductor device comprising:
a semiconductor chip having element electrodes;
an insulating film formed on the semiconductor chip to cover a side of each of the element electrodes and to expose at least a partial area of each of the element electrodes;
a plurality of projected stress relaxation materials formed on the insulating film and having low elastic moduli, a high heat resistance and a coefficient of thermal expansion in a range of 3 ppm–300 ppm;
projected electrodes covering at least portions of tops of the stress relaxation materials; and
wiring lines to electrically connect the projected electrodes to the element electrodes of the semiconductor chip,
wherein the stress relaxation materials have a glass transition point temperature not lower than 150° C.

35. The semiconductor device as set forth in claim 34, wherein
the glass transition point temperature of the stress relaxation materials is not lower than 180° C.

36. The semiconductor device as set forth in claim 34, wherein
the stress relaxation materials have glass transition point temperatures not lower then 200° C.

* * * * *